United States Patent
Go et al.

(10) Patent No.: US 10,269,881 B2
(45) Date of Patent: Apr. 23, 2019

(54) DISPLAY DEVICE AND MANUFACTURING METHOD THEREOF

(71) Applicant: Samsung Display Co., Ltd., Yongin-si, Gyeonggi-do (KR)

(72) Inventors: Jae Kyung Go, Yongin-si (KR); Eun Jae Na, Yongin-si (KR); Min Jun Jo, Yongin-si (KR); Hyun-Jun Choi, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 14/861,904

(22) Filed: Sep. 22, 2015

(65) Prior Publication Data
US 2016/0268356 A1   Sep. 15, 2016

(30) Foreign Application Priority Data

Mar. 10, 2015 (KR) .................. 10-2015-0033310

(51) Int. Cl.
*H01L 27/32* (2006.01)
*H01L 51/52* (2006.01)

(52) U.S. Cl.
CPC ...... *H01L 27/3248* (2013.01); *H01L 27/3246* (2013.01); *H01L 27/3276* (2013.01); *H01L 51/525* (2013.01); *H01L 51/5237* (2013.01); *H01L 27/3223* (2013.01); *H01L 2227/323* (2013.01)

(58) Field of Classification Search
CPC ............. H01L 27/3246; H01L 27/3283; H01L 27/3295
See application file for complete search history.

(56) References Cited

U.S. PATENT DOCUMENTS

2002/0180371 A1* 12/2002 Yamazaki ........... H01L 27/3246
                                                            315/169.3
2003/0030766 A1*  2/2003 Kiguchi ................ G02B 5/201
                                                            349/106

(Continued)

FOREIGN PATENT DOCUMENTS

CN    103545345 A    1/2014
EP       1635407 A1    3/2006

(Continued)

OTHER PUBLICATIONS

Extended European Search Report dated Jul. 28, 2016 in corresponding European Patent Application No. 15196452.5.

*Primary Examiner* — Bryan R Junge
(74) *Attorney, Agent, or Firm* — F. Chau & Associates, LLC

(57) ABSTRACT

A display device includes: a first substrate including: a display area including a plurality of pixels, and a peripheral area positioned around the display area; a thin film transistor positioned on the first substrate; a pixel electrode layer positioned on the thin film transistor and including more than one pixel electrodes positioned in the display area; and a pixel definition layer positioned on the pixel electrode layer and including a peripheral portion overlapping a voltage transmission electrode. The peripheral portion includes a spacer and an inclination portion connected to the spacer and positioned at a first side of the spacer, and the inclination portion has a concave inclination surface.

11 Claims, 24 Drawing Sheets

(56) References Cited

U.S. PATENT DOCUMENTS

| | | | |
|---|---|---|---|
| 2004/0095060 A1 | 5/2004 | Ushifusa et al. | |
| 2007/0085475 A1* | 4/2007 | Kuwabara | H01L 27/3246 313/506 |
| 2009/0128023 A1* | 5/2009 | Kwak | H01L 27/3246 313/504 |
| 2010/0033084 A1 | 2/2010 | Ko et al. | |
| 2010/0033646 A1* | 2/2010 | Baek | G02F 1/1345 349/42 |
| 2010/0112737 A1* | 5/2010 | Chen | G02F 1/133555 438/30 |
| 2011/0221334 A1 | 9/2011 | Kwon et al. | |
| 2011/0285326 A1* | 11/2011 | Kajitani | H01L 27/3246 315/312 |
| 2012/0256973 A1* | 10/2012 | Choi | H01L 51/5253 345/690 |
| 2013/0049003 A1* | 2/2013 | Choi | H01L 51/5246 257/72 |
| 2013/0069853 A1* | 3/2013 | Choi | H01L 27/3276 345/80 |
| 2014/0252321 A1 | 9/2014 | Pyon et al. | |
| 2015/0034921 A1 | 2/2015 | Kim | |
| 2016/0035980 A1 | 2/2016 | Kong et al. | |

FOREIGN PATENT DOCUMENTS

| | | |
|---|---|---|
| JP | 5515522 | 4/2014 |
| KR | 10-2009-0013857 | 2/2009 |
| KR | 10-2013-0137455 | 12/2013 |

* cited by examiner

DISPLAY DEVICE AND MANUFACTURING METHOD THEREOF

CROSS-REFERENCE TO RELATED APPLICATION

Any and all applications for which a foreign or domestic priority claim is identified in the Application Data Sheet as filed with the present application are hereby incorporated by reference under 37 CFR 1.57.

This application claims priority to Korean Patent Application No. 10-2015-0033310 filed on Mar. 10, 2015, and all the benefits accruing therefrom under 35 U.S.C. § 119, the entire contents of which are incorporated herein by reference.

BACKGROUND

Field

The disclosure relates to a display device and a manufacturing method thereof.

Description of the Related Technology

A display device, such as for example a liquid crystal display (LCD), an organic light emitting diode (OLED) display, and an electrophoretic display, includes a field generating electrode and an electro-optical active layer. For example, the LCD device includes a liquid crystal layer as the electro-optical active layer. The field generating electrode is connected to a switching element such as a thin film transistor to receive a data signal, and the electro-optical active layer converts the data signal into an optical signal to display an image.

Among the display devices, since the organic light emitting diode (OLED) display as a self-light emitting type does not require a separate light source, it is advantageous in terms of power consumption, and a response speed, a viewing angle, and a contrast ratio thereof are excellent.

The organic light emitting diode (OLED) display includes a plurality of pixels such as red pixels, blue pixels, green pixels, and white pixels, and may express full colors by combining the pixels. Each pixel includes an organic light emitting element, and a plurality of thin film transistors for driving the organic light emitting element.

The light emitting element of the organic light emitting diode (OLED) display includes a pixel electrode, an opposing electrode, and a light emitting layer positioned between the two electrodes. One of the pixel electrode and the opposing electrode is referred to as an anode, and the other electrode a cathode. An electron injected from the cathode and a hole injected from the anode are coupled with each other in the light emitting layer to form an exciton, and the exciton emits light while discharging energy. The opposing electrode is formed throughout a plurality of pixels to transfer a predetermined common voltage.

In display devices, when impurities such as moisture or oxygen flow into the display device from an ambient environment, oxidization, releasing, and the like of the electrode occur, and as a result, a lifespan of the device is shortened or light emission efficiency may deteriorate, and problems such as deformation of a light emitting color may occur.

Accordingly, when the display device is manufactured, sealing is performed so that an internal element is separated from the outside to prevent impurities such as moisture from penetrating. As such a sealing method, in the case of the organic light emitting diode (OLED) display, may be generally, a method of laminating a layer including an organic polymer such as polyethylene terephalate (PET) on a completed lower substrate, a method of forming a cover or a cap on an encapsulation substrate and sealing an edge of a cover lower substrate and the encapsulation substrate with a sealant, or the like.

The above information disclosed in this Background section is only for enhancement of understanding of the background and therefore it may contain information that does not form the prior art that is already known in this country to a person of ordinary skill in the art.

SUMMARY OF THE INVENTIVE ASPECTS

A display device according to an embodiment includes: a first substrate including: a display area including a plurality of pixels, and a peripheral area positioned around the display area; a thin film transistor positioned on the first substrate; a pixel electrode layer positioned on the thin film transistor and including: a plurality of pixel electrodes positioned in the display area, and a voltage transmission electrode positioned in the peripheral area; and a pixel definition layer positioned on the pixel electrode layer and including a peripheral portion overlapping the voltage transmission electrode, wherein the peripheral portion includes: a spacer, and an inclination portion connected to the spacer and positioned at a first side of the spacer, and wherein the inclination portion has a concave inclination surface.

The peripheral portion may further include a main portion connected to the spacer and positioned at a second side opposite to the first side of the spacer.

A second substrate facing the first substrate and a sealant formed between the first substrate and the second substrate and positioned in the peripheral area may be further included, and the main portion may be positioned at a side facing the sealant.

A height of a top surface of the spacer with respect to the first substrate may be higher than a height of a top surface of the main portion and the inclination portion.

A thickness of the inclination portion may be smaller than a thickness of the main portion.

A height of the bottom surface of the main portion may be lower than a height of the bottom surface of the inclination portion.

A voltage transmission line positioned in the peripheral area and transmitting a common voltage, and a passivation layer positioned between the thin film transistor and the pixel electrode layer may be further included, wherein the passivation layer may include an edge side surface exposing the voltage transmission line, and the voltage transmission electrode may include a first portion covering the edge side surface of the passivation layer and a second portion connected to the voltage transmission line.

The spacer may include at least one part covering the edge side surface of the passivation layer.

The peripheral portion may cover an edge of the voltage transmission electrode.

An edge of the spacer at the first side may have a shape of protrusions and depressions and include recess portions and convex portions that are alternately arranged.

The inclination portion may include a plurality of portions positioned in the recess portion in a plan view, and each of the plurality of portions included in the inclination portion may have a concave inclination surface.

The voltage transmission electrode may include a plurality of holes, and each of the plurality of portions of the inclination portion may respectively overlap each of the holes.

A hole adjacent to a first hole overlapping the inclination portion among the plurality of holes may be disposed to be aligned with the first hole.

A hole adjacent to a first hole overlapping the inclination portion among the plurality of holes may be disposed to be shifted from the first hole.

An edge of the spacer at the first side having the protrusions and depressions shape may include a first convex portion and a second convex portion having different lengths from each other.

The spacer and the inclination portion may be elongated along an edge side of the first substrate.

A manufacturing method of a display device according to an embodiment includes: forming a thin film transistor on a first substrate including a display area and a peripheral area around the display area; forming, on the thin film transistor, a pixel electrode layer including a plurality of pixel electrodes positioned in the display area, and a voltage transmission electrode positioned in the peripheral area on the thin film transistor; coating a photosensitive material on the pixel electrode layer to form a coating layer; exposing the coating layer by using a photomask including a light transmissive part, a light blocking part, and a semi-transmissive part; developing the exposed coating layer; and hardening the developed coating layer to form a pixel definition layer including a peripheral portion overlapping the voltage transmission electrode, wherein the peripheral portion includes a spacer and an inclination portion connected to the spacer and positioned at a first side of the spacer, and wherein the inclination portion has a concave inclination surface.

The peripheral portion may further include a main portion connected to the spacer and positioned at a second side opposite to the first side of the spacer.

A thickness of the coating layer corresponding to the main portion may be thicker than a thickness of the coating layer corresponding to the inclination portion.

According to an embodiment, when applying an impact to the display device including the sealant, the impact wave is effectively dispersed such that the impact wave may be prevented from being transmitted to the sealant, thereby increasing the strength of the display device.

Adhesion reliability of the encapsulation region may be increased without a failure of the electrode of the display device including the sealant.

A display device having the narrow bezel while having high strength may be provided.

DETAILED DESCRIPTION OF CERTAIN INVENTIVE EMBODIMENTS

Figure 1:
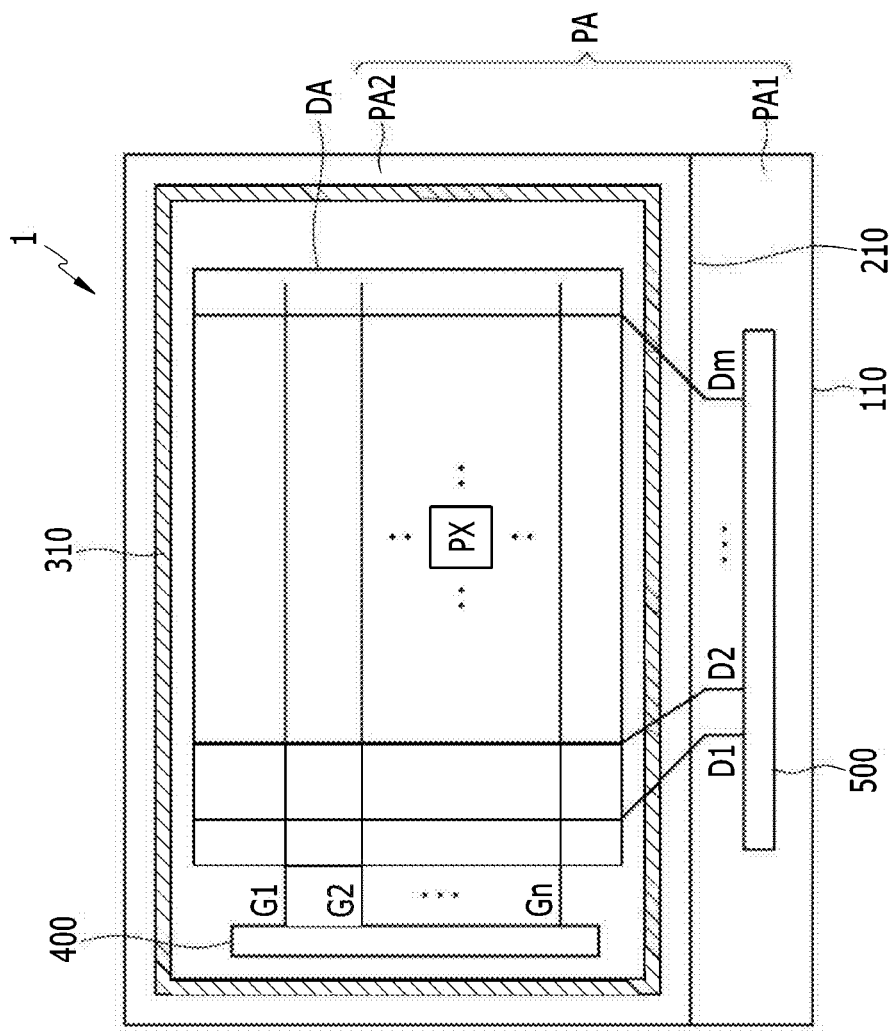
FIG. 1 is a layout view of a display device according to an embodiment.

The present disclosure will be described more fully hereinafter with reference to the accompanying drawings, in which certain embodiments of the invention are shown. As those skilled in the art would realize, the described embodiments may be modified in various ways, without departing from the spirit or scope of the present invention.

In the drawings, the thickness of layers, films, panels, regions, etc., may be exaggerated for clarity. Like reference numerals generally designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

A display device according to an embodiment will be described with reference to FIG. 1 to FIG. 8.

Figure 2:
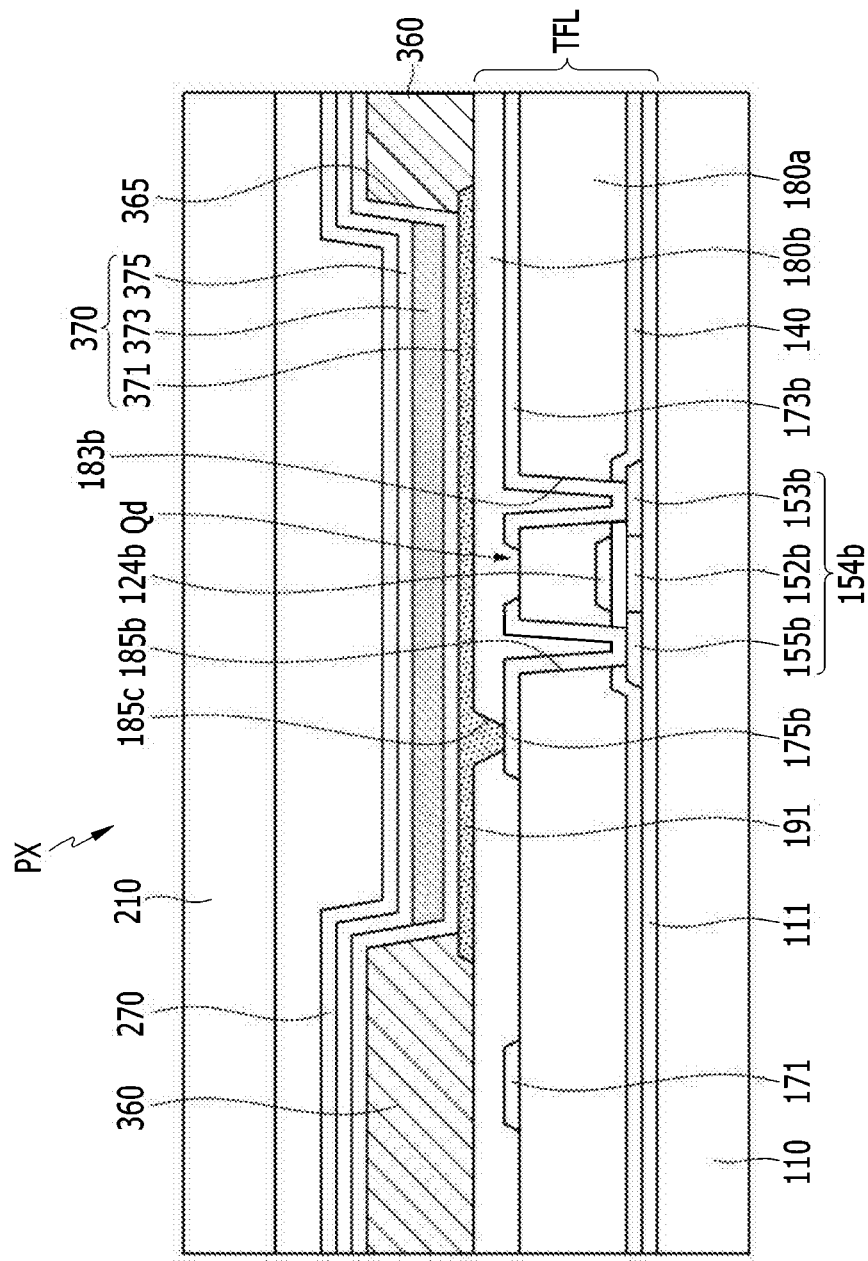
FIG. 2 is a cross-sectional view of one pixel of the display device according to the embodiment.
Figure 3:
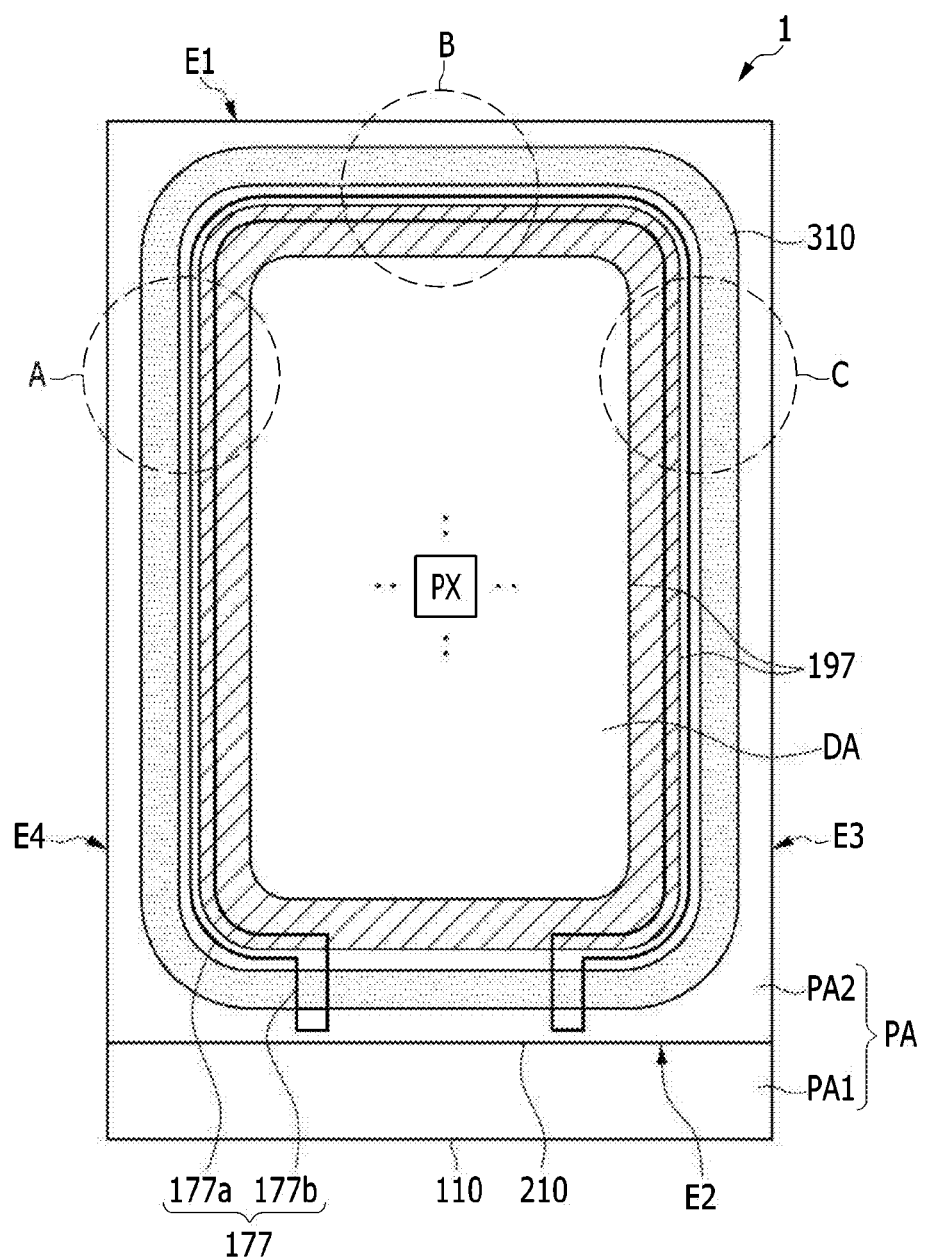
FIG. 3 is a layout view of a peripheral area of a display device according to an embodiment.
Figure 4:
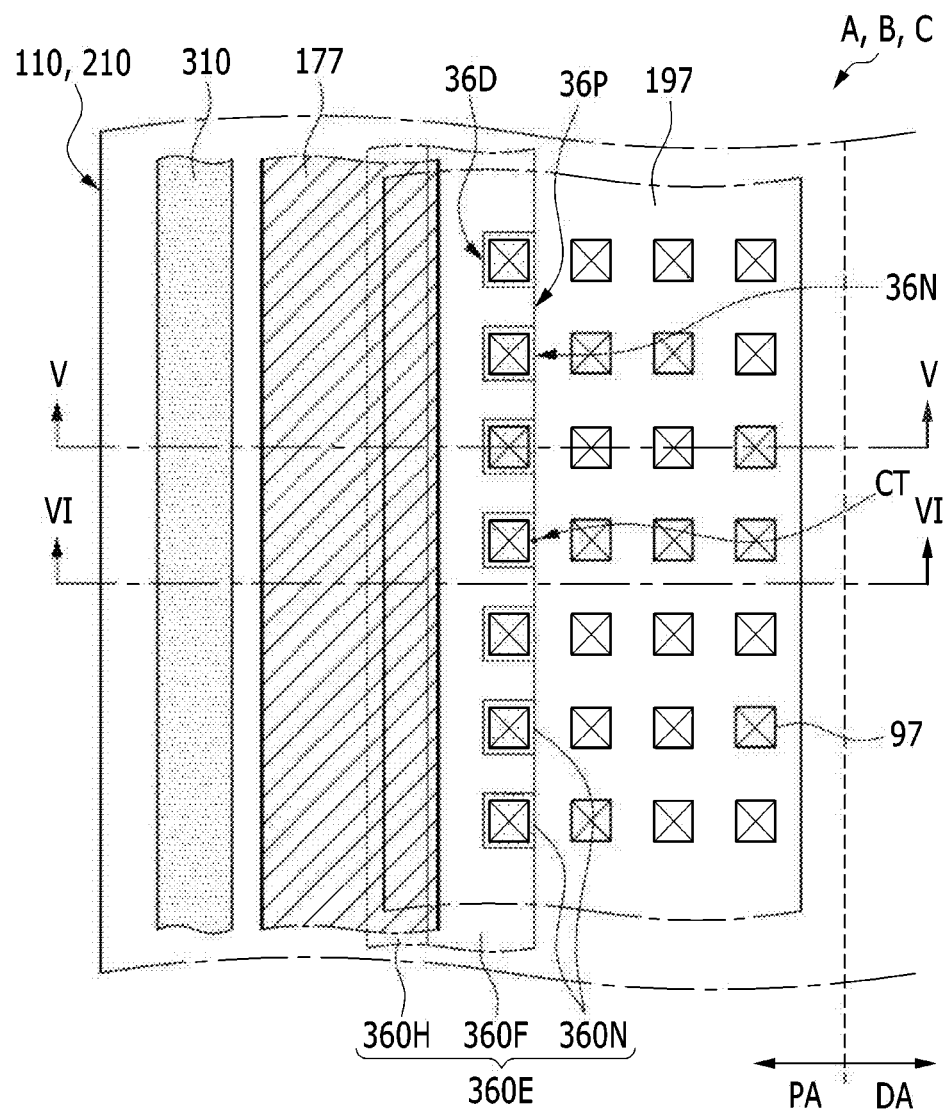
FIG. 4 is an enlarged layout view of a region A, a region B, or a region C as a part of a peripheral area of the display device shown in FIG. 3.
Figure 5:
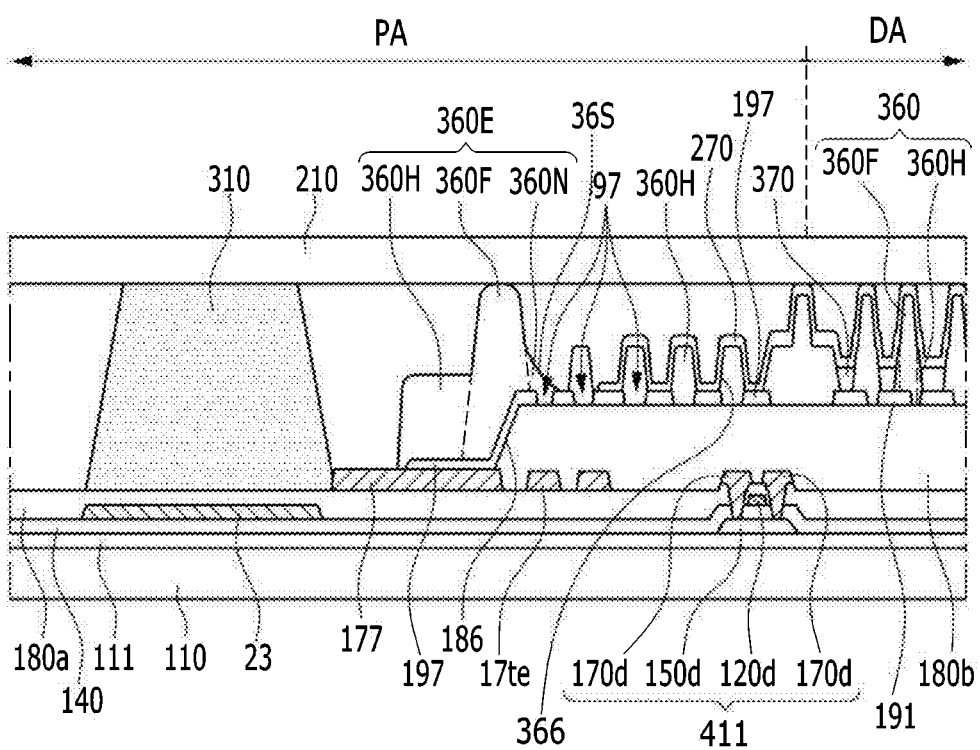
FIG. 5 is a cross-sectional view of the display device of FIG. 4 taken along a line V-V.
Figure 6:
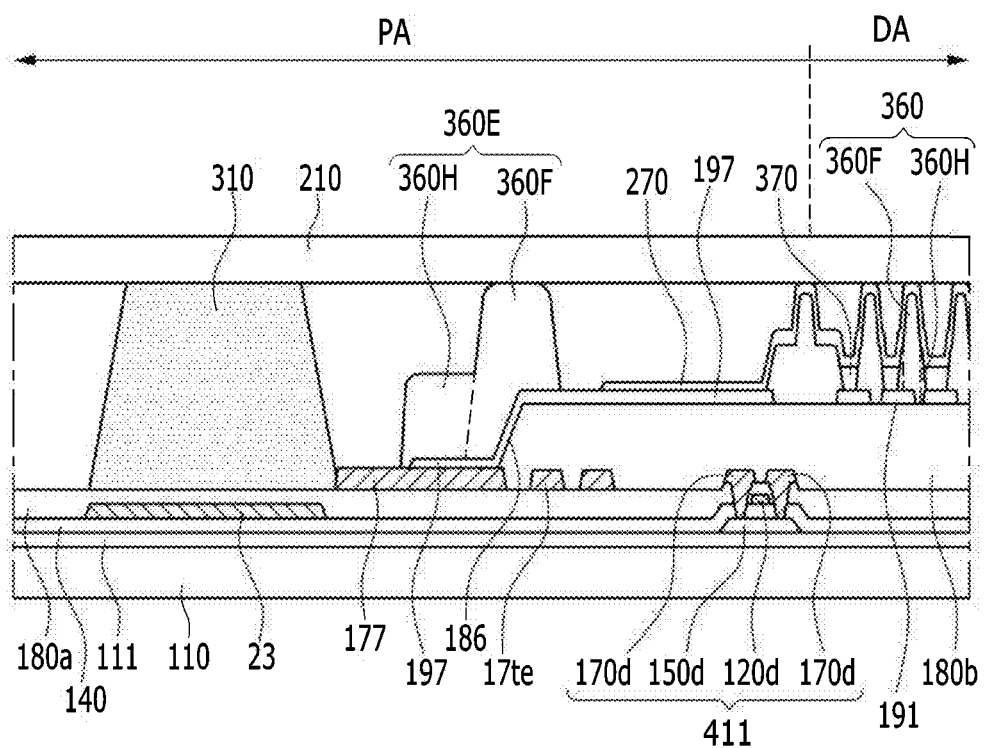
FIG. 6 is a cross-sectional view of the display device of FIG. 4 taken along a line VI-VI.

FIG. 1 is a layout view of a display device according to an embodiment, FIG. 2 is a cross-sectional view of one pixel of the display device according to the embodiment, FIG. 3 is a layout view of a peripheral area of a display device according to an embodiment, FIG. 4 is an enlarged layout view of a region A, a region B, or a region C as a part of a peripheral area of the display device shown in FIG. 3, FIG. 5 is a cross-sectional view of the display device of FIG. 4 taken along a line V-V, and FIG. 6 is a cross-sectional view of the display device of FIG. 4 taken along a line VI-VI.

First, referring to FIG. 1 and FIG. 3, a display panel 1 of a display device according to an embodiment includes a display area DA which is an area displaying an image, and a peripheral area PA therearound when viewed in a plan view. Referring to FIG. 2, when viewed from a cross-sectional view, the display device 1 includes a lower substrate 110 and an encapsulation substrate 210 facing each other.

The lower substrate 110 includes the display area DA and the peripheral area PA1 therearound, and the encapsulation substrate 210 includes the display area DA and the peripheral area PA2 therearound. When viewed in a plan view, the peripheral area PA2 of the encapsulation substrate 210 may be included in the peripheral area PA1 of the lower substrate 110. The peripheral area PA of the display device 1 includes the peripheral area PA1 of the lower substrate 110 and the peripheral area PA2 of the encapsulation substrate 210.

Referring to FIG. 3, edges of the encapsulation substrate 210 may include an upper side edge E1, a lower side edge E2 facing the upper side edge E1, and a right side edge E3 and a left side edge E4 connecting between the upper side edge E1 and the lower side edge E2. As shown in the drawings, the upper side edge E1, the lower side edge E2, the right side edge E3, or the left side edge E4 may each substantially be a straight line, and at least one thereof may include a curved line portion.

The display area DA includes a plurality of signal lines and a plurality of pixels PX connected to the signal lines. The plurality of pixels PX may be arranged substantially in a matrix form, however they are not limited thereto.

The signal lines are provided on the lower substrate 110, and include a plurality of gate lines or scanning signal lines G1-Gn transferring scanning signals, and a plurality of data lines D1-Dm transferring data voltages. The gate lines G1-Gn extend substantially in a row direction and are almost parallel to each other, and the data lines D1-Dm extend substantially in a column direction and are almost parallel to each other.

Referring to FIG. 1 and FIG. 2, the pixel PX positioned in the display area DA may include at least one switching element Qd connected to at least one of gate lines G1-Gn, and at least one of data lines D1-Dm and data line 171, at least one pixel electrode 191 connected to the switching element Qd, and an opposing electrode 270. In the case of an organic light emitting diode (OLED) display, a light emitting layer is positioned between the pixel electrode 191 and the opposing electrode 270 to form a light emitting element. The switching element Qd may include at least one thin film transistor. The opposing electrode 270 may transmit a common voltage ELVSS.

In order to implement a color display, each pixel PX may display one of primary colors, and a desired color may be recognized by combining the primary colors. An example of primary colors may include three primary colors or four primary colors such as red, green, blue, and the like. Each pixel PX may further include a color filter positioned at a place corresponding to each pixel electrode and expressing one of the primary colors, and the light emitting layer may be a colored light emitting layer.

Referring to FIG. 1, the encapsulation substrate 210 may expose a part of the peripheral area PA1 of the lower substrate 110, and the exposed part is referred to as a pad part. In the pad part, at least one data driver 500 to drive the light-emitting device may be mounted in a type of at least one IC chip. Alternatively, the driver 500 may be mounted on a flexible printed circuit (FPC) film or a printing circuit board to be attached to the pad part in a type of a TCP (tape carrier package), or may be directly integrated with the lower substrate 110. In the pad part, ends extended from the signal lines such as the data lines D1-Dm of the display area DA may be positioned. The data driver 500 may be connected to the end of the data lines D1-Dm and transmitting a data signal to the data lines D1-Dm.

A gate driver 400 to drive the light-emitting device may also be positioned in the peripheral area PA1 of the lower substrate 110 covered by the encapsulation substrate 210. The driver 400 may be mounted on the lower substrate 110 in the type of at least one IC chip, or may be mounted on the flexible printed circuit (FPC) film or the printing circuit board to be attached to the lower substrate 110 in the type of the TCP, or may be integrated with the lower substrate 110. The gate driver 400 may be connected to the gate lines G1-Gn and transmitting the gate signal to the gate lines G1-Gn.

Now, a detailed structure of the display device according to an embodiment will be described with reference to FIG. 1 to FIG. 6.

A buffer layer 111 may be positioned on the peripheral area PA1 and the display area DA of the lower substrate 110 including transparent glass or plastic. The buffer layer 111 may prevent impurities from penetrating, and a surface thereof may be flat. The buffer layer 111 may include a silicon nitride (SiNx), a silicon oxide (SiOx), a silicon oxynitride (SiOxNy), or the like. The buffer layer 111 may be omitted in some embodiments.

At least one semiconductor layer is positioned on the buffer layer 111.

The semiconductor layer includes a first semiconductor 154b positioned in the display area DA. The first semiconductor 154b may include a channel region 152b, and a source region 153b and a drain region 155b positioned at respective sides of the channel region 152b and formed to be doped. The semiconductor layer may further include at least one second semiconductor 150d (see FIG. 5) positioned in the peripheral area PA1 of the lower substrate 110. Although not shown, the second semiconductor 150d may include a channel region, and a source region and a drain region positioned at respective sides of the channel region and formed to be doped.

The semiconductor layer may include amorphous silicon, polysilicon, or an oxide semiconductor.

A gate insulating layer 140 including a silicon nitride (SiNx) or a silicon oxide (SiOx) is positioned on the semiconductor layer.

A plurality of gate conductors are positioned on the gate insulating layer 140. The gate conductor includes a first control electrode 124b positioned in the display area DA. The first control electrode 124b may overlap a part of the first semiconductor 154b, particularly the channel region. The gate conductor may further include at least one second control electrode 120d (see FIG. 5) positioned in the peripheral areas PA1 and PA2. The second control electrode 120d may include a part overlapping the second semiconductor 150d, particularly the channel region of the second semiconductor 150d.

The gate conductor may further include a thermal transmission layer 23 (see FIG. 5) positioned in the peripheral area PA1 and PA2.

A first passivation layer 180a is positioned on the gate insulating layer 140 and the gate conductor. The first passivation layer 180a and the gate insulating layer 140 may include a contact hole 183b exposing the source region 153b of the first semiconductor 154b, and a contact hole 185b exposing the drain region 155b in the display area DA. The first passivation layer 180a and the gate insulating layer 140 may include contact holes (not shown) respectively exposing the source region and the drain region of the second semiconductor 154d in the peripheral areas PA1 and PA2.

A plurality of data conductors are positioned on the first passivation layer 180a.

The data conductors may include a plurality of data lines 171, a driving voltage line (not shown), and a plurality of first output electrodes 175b. The driving voltage line transmits a driving voltage ELVDD and may include a plurality of first input electrodes 173b extending toward a first control electrode 124b. The first output electrode 175b faces the first input electrode 173b on the first semiconductor 154b. The first input electrode 173b and the first output electrode 175b may be respectively connected to the source region 153b and the drain region 155b of the first semiconductor 154b through the contact holes 183b and 185b.

The data conductor may further include a voltage transmission line 177 (see FIG. 5) positioned in the peripheral area PA1 and PA2. The voltage transmission line 177 transmits a common voltage ELVSS.

Referring to FIG. 3, the voltage transmission line 177 may include a main transmission part 177a and an end 177b connected thereto. The main transmission part 177a is formed along the edge of the display area DA and extends along the upper side edge E1, the right side edge E3, and the left side edge E4 of the encapsulation substrate 210. The end 177b is positioned to be close to the lower side edge E2 and may extend to the pad part of the lower substrate 110. The end 177b may include two parts positioned at respective ends of the main transmission part 177a and separated from each other near the lower side edge E2, but is not limited thereto.

The data conductor may further include at least one second input/output electrode 170d (see FIG. 5) positioned in the peripheral area PA1 and PA2. The data conductor may further include a test signal line 17te (see FIG. 5) positioned in the peripheral areas PA1 and PA2. The test signal line 17te may be omitted in some embodiments.

The first control electrode 124b, the first input electrode 173b, and the first output electrode 175b form a switching element Qd as a transistor along the first semiconductor 154b. The structure of the switching element Qd is not limited thereto and may be changed in various embodiments.

The second control electrode 120d, the second input/output electrode 170d, and the second semiconductor 150d may together form at least one transistor 411. The transistor 411 may be included in the driver to drive the light-emitting device. This driver may be the gate driver outputting the gate signal to the gate line G1-Gn.

A second passivation layer 180b including an inorganic insulating material and/or an organic insulating material is positioned on the data conductor. The second passivation layer 180b may have a substantially flat surface to increase emission efficiency of the organic light emitting element to be formed thereon. The second passivation layer 180b may have a contact hole 185c exposing the first output electrode 175b in the display area DA.

In the peripheral area PA1, the second passivation layer 180b exposes at least a portion of the voltage transmission line 177. Referring to FIG. 5 and FIG. 6, the second passivation layer 180b includes an edge side surface 186 positioned in the peripheral area PA1, and the edge side surface 186 may include a bottom side positioned in the top surface of the voltage transmission line 177. Accordingly, the second passivation layer 180b may expose the voltage transmission line 177 in the peripheral area PA1.

A pixel electrode layer is positioned on the second passivation layer 180b.

The pixel electrode layer includes a pixel electrode 191 positioned in each pixel PX of the display area DA. The pixel electrode 191 is physically and electrically connected to the first output electrode 175b through the contact hole 185c of the second passivation layer 180b.

The pixel electrode layer may further include a voltage transmission electrode 197 positioned in the peripheral area PA1 and PA2. Referring to FIG. 5 and FIG. 6, the voltage transmission electrode 197 includes a part covering the edge side surface 186 of the second passivation layer 180b in the peripheral areas PA1 and PA2 and is physically and electrically connected to the voltage transmission line 177, thereby receiving the common voltage ELVSS. The voltage transmission electrode 197 may form a step on the portion covering the edge side surface 186 of the second passivation layer 180b.

Referring to FIG. 3, the voltage transmission electrode 197 may be formed along the display area DA, for example, may be formed of a closed line enclosing the display area DA, but it is not limited thereto. The voltage transmission electrode 197 may extend with a uniform width as shown, however it may have different widths depending on the position. When the voltage transmission electrode 197 has a non-uniform width, portions having different widths may be alternately disposed.

The voltage transmission electrode 197 may include a plurality of holes 97. The plurality of holes 97 are formed on the second passivation layer 180b. The holes 97 may be arranged in a predetermined type such as a matrix shape as an example, or not. The holes 97 provide an outlet exhausting a gas generated in the second passivation layer 180b when heat is applied in a subsequent process, thereby preventing the voltage transmission electrode 197 from being lifted from the second passivation layer 180b by the gas.

The pixel electrode layer may include a semi-transmissive conductive material or a reflective conductive material.

Referring to FIG. 2, the layers on the lower substrate 110, for example, the layers from the buffer layer 111 to the second passivation layer 180b, are referred to together as a transistor layer TFL.

A pixel definition layer 360 is positioned on the second passivation layer 180b and the pixel electrode layer.

Referring to FIG. 2, FIG. 5, and FIG. 6, the pixel definition layer 360 includes a spacer 360F having a higher top surface than the top surface of the main portion 360H with respect to a main portion 360H and the lower substrate 110. The spacer 360F is formed to be higher than the main portion 360H such that the top surface may contact the surface of the encapsulation substrate 210. The spacer 360F may uniformly maintain a separation distance between the encapsulation substrate 210 and the lower substrate 110.

The main portion 360H of the pixel definition layer 360 positioned in the display area DA has a plurality of holes 365 defining a region of each pixel PX exposing each pixel electrode 191. The spacer 360F of the pixel definition layer 360 positioned in the display area DA is connected to the main portion 360H. In the display area DA, the spacer 360F may be positioned between adjacent pixels PX.

The main portion 360H of the pixel definition layer 360 positioned in the peripheral areas PA1 and PA2 includes a plurality of portions each of which covers the respective hole 97 of the voltage transmission electrode 197. The portions of the main portion 360H covering the holes 97 are substantially positioned on an upper surface of the second passivation layer 180b. The portions of the main portion 360H each covering the respective hole 97 may be separated from each other so that each of the portions of the main portion 360H covering the holes 97 may have an island type. FIG. 5 depicts a sectional view where such island-type main portions 360H are located, while FIG. 6 depicts a sectional view where such island-type main portions 360H are not located.

The pixel definition layer 360 positioned in the peripheral area PA1 and PA2 includes a peripheral portion 360E. The peripheral portion 360E may cover the edge of the voltage transmission electrode 197, and includes the portion overlapping the voltage transmission electrode 197. The peripheral portion 360E is positioned on the edge side surface 186 of the second passivation layer 180b thereby including the portion overlapping the edge side surface 186. The peripheral portion 360E may include a portion that directly contacts the top surface of the portion of the voltage transmission line 177. The peripheral portion 360E is positioned between a sealant 310 described below and the display area DA to be positioned to be close to the sealant 310.

In detail, referring to FIG. 4, FIG. 5, and FIG. 6, the peripheral portion 360E includes the main portion 360H, the spacer 360F, and an inclination portion 360N connected to each other. The spacer 360F is positioned between the main portion 360H and the inclination portion 360N.

The main portion 360H of the peripheral portion 360E is positioned on the voltage transmission electrode 197, and covers the edge of the voltage transmission electrode 197 to not be exposed outside. The main portion 360H of the peripheral portion 360E may be elongated along the edge of the voltage transmission electrode 197. Also, in the peripheral portion 360E, the main portion 360H may include the portion extending to be parallel to at least one among the upper side edge E1, the right side edge E3, and the left side edge E4 of the encapsulation substrate 210. In the peripheral portion 360E, the main portion 360H may include a portion contacting the top surface of the voltage transmission line 177. The main portion 360H of the peripheral portion 360E may be positioned at the side opposing the sealant 310 described below.

The spacer 360F of the peripheral portion 360E is connected to the main portion 360H and may have a height that is higher than the height of the main portion 360H. In the peripheral portion 360E, at least a portion of the top surface of the spacer 360F may directly contact the bottom surface of the encapsulation substrate 210. The thickness of the spacer 360F of the peripheral portion 360E may be thicker than the thickness of the main portion 360H. In the peripheral portion 360E, the spacer 360F is positioned on the edge side surface 186 of the second passivation layer 180b and may include the portion overlapping the edge side surface 186, however it is not limited thereto.

Referring to FIG. 4, the edge that does not contact the main portion 360H among the edge of the spacer 360F of the peripheral portion 360E may have a protrusion and depression shape, a sawtooth shape, or a zigzag shape, among others. The edge having the protrusion and depression shape of the spacer 360F may include a recess portion (depression) 36D and a convex portion (protrusion) 36P that are alternately arranged. The shape of the recess portion 36D and the convex portion 36P of the edge of the protrusions and depressions shape of the spacer 360F may be a ring shape such as a circular shape or an oval shape, however it is not limited thereto, and it may be various shapes such as triangular or quadrangular, for example. Also, in the peripheral portion 360E, the shape of the recess portion 36D and the convex portion 36P of the edge of the protrusions and depressions shape of the spacer 360F may be uniform along the extending direction of the spacer 360F, or different shapes from each other may be regularly arranged.

The inclination portion 360N is connected to the spacer 360F of the peripheral portion 360E. The height oft most top surface of the inclination portion 360N is lower than the most top surface of the spacer 360F, and the thickness of the inclination portion 360N may be smaller than the thickness of the spacer 360F. Also, in the peripheral portion 360E, the thickness of the main portion 360H positioned outside with reference to the spacer 360F may be thicker than the thickness of the inclination portion 360N positioned near the display area DA with reference to the spacer 360F. The main portion 360H of the peripheral portion 360E is positioned on the region where there is no second passivation layer 180b with reference to the edge side surface 186 of the second passivation layer 180b, and the inclination portion 360N of the peripheral portion 360E may be positioned on the region where the second passivation layer 180b exists with reference to the edge side surface 186 of the second passivation layer 180b. Accordingly, the height of the bottom surface of the main portion 360H of the peripheral portion 360E may be lower than the height of the bottom surface of the inclination portion 360N.

An inclination surface 36S as the top surface of the inclination portion 360N may be an inclination surface toward the display area DA.

One height with reference to the lower substrate 110 of the inclination surface 36S of the inclination portion 360N may be lower farther away from the portion connected to the spacer 360F. Referring to FIG. 4, the inclination surface 36S of the inclination portion 360N may be lower to be close to the direction farther from the recess portion 36D and the convex portion 36P of the adjacent spacer 360F.

Particularly, the inclination surface 36S of the inclination portion 360N may form a concave inclination surface. As shown in FIG. 5, in a view of the cross-sectional view of the display device, a slope of an imaginary tangent contacting the inclination surface 36S of the inclination portion 360N may have a decreased absolute value farther away from the portion connected to the spacer 360F. The inclination surface 36S of the inclination portion 360N may form a concave surface. The inclination surface 36S of the inclination portion 360N may have a similar shape to the concave inclination surface of a sand dune.

As shown in FIGS. 4 to 6, the inclination portion 360N may be divided into a plurality of portions by the convex portion 36P of the spacer 360F in a plan view. FIG. 5 depicts a sectional view where the inclination portion 360N is located, and FIG. 6 depicts a sectional view where the inclination portion 360N is not located. Each portion of the inclination portion 360N may be positioned in the recess portion 36D corresponding to the spacer 360F in a plan view. Each inclination surface 36S of the inclination portion 360N may have the concave inclination surface. The height of the inclination surface 36S of each portion of the inclination portion 360N may be decreased substantially toward the center CT of the outside edge 36N that is not adjacent to the spacer 360F.

FIG. 6 shows a sectional view where the inclination portion 360N is not located. Referring to FIG. 6, the right-side lateral surface of the spacer 360F corresponding to a portion between neighboring inclination portions 360N may have a different shape from the inclination surface 36S of the inclination portion 360N but may have a similar shape as the left-side lateral surface of the spacer 360F or have a similar or same degree of inclination as the left-side lateral surface of the spacer 360F. The embodiment, however, is not limited thereto, and the right-side lateral surface of the spacer 360F corresponding to a portion between neighboring inclination portions 360N may have a different shape from the left-side lateral surface of the spacer 360F. According to this, the degree of inclination of the right-side lateral surface of the spacer 360F may vary more gradually than the left-side lateral surface of the spacer 360F, and the right-side lateral surface of the spacer 360F have a rather similar shape as the inclination surface 36S of the inclination portion 360N. That is, the inclination portion 360N according to an embodiment may be continuously formed along the right-side of the spacer 360F rather than formed in a plurality of separated portions. In this case, the shape of the inclination surface or the inclination degree of the continuous inclination portion 360N may vary periodically along the right-side of the spacer 360F.

The shape of the edge side in which each portion of the inclination portion 360N divided by the convex portion 36P is adjacent to the spacer 360F may depend on the shape of the recess portion 36D of the spacer 360F. When the shape of the recess portion 36D is the curved line, the shape of the edge side in which each portion of the inclination portion 360N is adjacent to the spacer 360F may be formed of the curved line. In this case, each portion of the inclination portion 360N may be formed of the shape such as a parabolic dune as an example.

Figure 7:
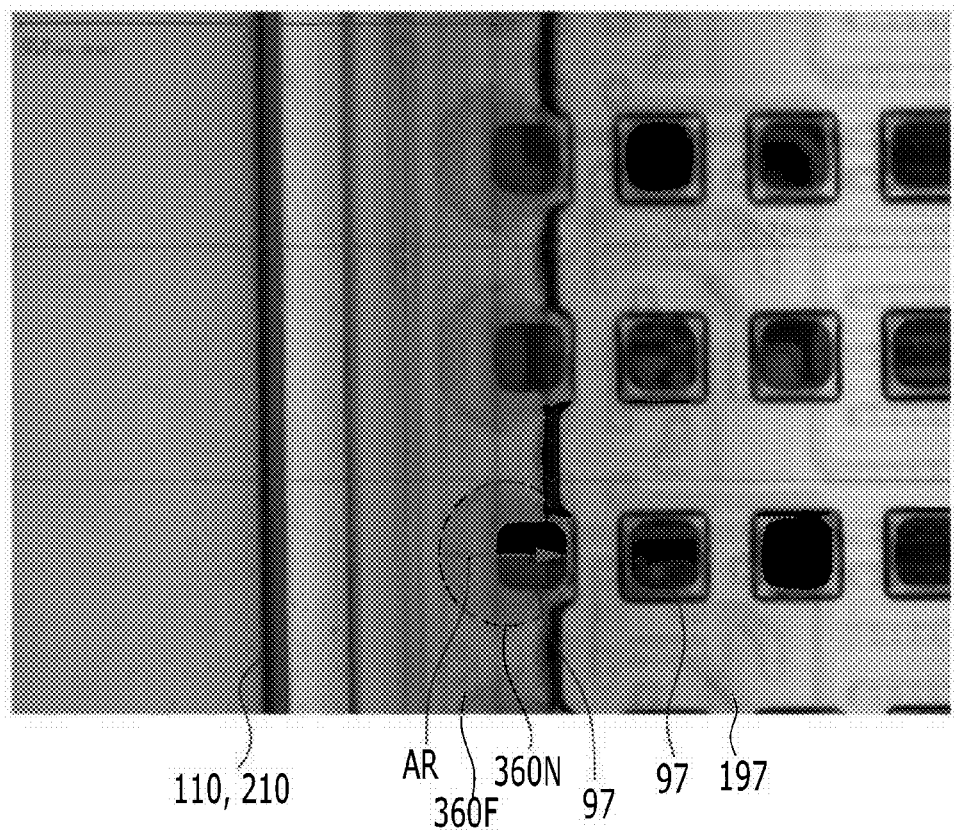
FIG. 7 is a photo showing a plane shape of a peripheral area of a display device according to an embodiment.

FIG. 7 is a photo showing the plane shape of the display device corresponding to FIG. 4. Referring to FIG. 7, for the inclination portion 360N, as described above, the height of the inclination surface 36S above the lower substrate 110 is decreased toward the outer edge 36N of the inclination portion 360N, as shown by an arrow AR. Also, FIG. 7 shows an example in which the shape of the edge side where each portion of the inclination portion 360N is adjacent to the spacer 360F forms the curved line such as the circle.

Referring back to FIG. 4, the outside edge 36N of the inclination portion 360N that is not connected to the spacer 360F of the peripheral portion 360E may be approximately aligned to the outer sides of the convex portion 36P of the spacer 360F, however it is not limited thereto and it may be shifted.

As shown in FIG. 4 and FIG. 7, the inclination portion 360N may overlap the portion of the plurality of holes 97 of the voltage transmission electrode 197. In detail, the inclination portion 360N may be positioned corresponding to the holes 97 of one column disposed nearest to the voltage transmission line 177 among the plurality of holes 97 of the voltage transmission electrode 197. When the inclination portion 360N is divided into the plurality of portions by the convex portion 36P of the spacer 360F, each portion of the inclination portion 360N may be disposed corresponding to one hole 97 or two or more holes 97 of the voltage transmission electrode 197 as described above.

The pixel definition layer 360 may include a photosensitive material such as a polyacrylate resin or a polyimide series.

In the display area DA, an emission member 370 is positioned on the pixel definition layer 360 and the pixel electrode 191. Referring to FIG. 2, the emission member 370 may include a first organic common layer 371, a plurality of emission layers 373, and a second organic common layer 375 which are laminated in sequence.

The first organic common layer 371 may include at least one of a hole injecting layer (HIL) and a hole transport layer (HTL). The first organic common layer 371 may be formed all over the display area in which the pixels PX are disposed, or may only be formed in each pixel PX region.

The emission layer 373 may be positioned on the pixel electrode 191 of each corresponding pixel PX. The emission layer 373 may include an organic material which uniquely emits light of the primary colors such as red, green, and blue, and may have a structure in which a plurality of organic material layers emitting light of different colors are laminated. According to an embodiment, the emission layer 373 may include a white emission layer representing a white color.

The second organic common layer 375 may include, for example, at least one of an electron transport layer (ETL) and an electron injecting layer (EIL).

At least one of the first and second organic common layers 371 and 375 may be omitted in some embodiments.

The opposing electrode 270 transmitting the common voltage ELVSS is positioned on the emission member 370. The opposing electrode 270 is mainly positioned in the display area DA extends to the peripheral areas PA1 and PA2, as shown in FIG. 5 and FIG. 6, and is physically and electrically connected to the voltage transmission electrode 197 through the contact hole 366 of the main portion 360H of the pixel definition layer 360, thereby receiving the common voltage ELVSS.

The opposing electrode 270 may include a transparent conductive material. For example, when the opposing electrode 270 includes a metal such as for example, Ca, Ba, Mg, Al, and Ag, the metal layer may be thinly formed to have a light transmissive function.

The pixel electrode 191, the emission member 370, and the opposing electrode 270 of each pixel PX form a light emitting diode, and one of the pixel electrode 191 and the opposing electrode 270 serves as a cathode, while the other serves as an anode.

The encapsulation substrate 210 facing the lower substrate 110 is positioned on the opposing electrode 270.

The encapsulation substrate 210 may prevent moisture and/or oxygen from passing through from the outside by encapsulating the emission member 370 and the opposing electrode 270.

A sealant 310 is positioned between the lower substrate 110 and the encapsulation substrate 210. The sealant 310 is positioned in the peripheral area PA1 of the lower substrate 110 and the peripheral area PA2 of the encapsulation substrate 210, and encloses the display area DA while forming the closed line. The sealant 310 combines and fixes the lower substrate 110 and the encapsulation substrate 210 and prevents impurities such as moisture and oxygen from the outside from penetrating between the lower substrate 110 and the encapsulation substrate 210, thereby encapsulating the electric optical active layer of the light-emitting device.

The sealant 310 may include a frit having excellent moisture resistance, and may also include an organic sealant and moisture absorbent. Particularly, the sealant 310 may include a sealant which is positioned between the lower substrate 110 and the encapsulation substrate 210 to fuse the lower substrate 110 and the encapsulation substrate 210 by applying heat. In this case, the heat may be applied by using an infrared lamp, a laser, or the like. Alternatively, the sealant 310 may also include a light absorbent which may absorb a laser, infrared light, or the like. The frit may generally use an oxide powder included in a glass powder, and may include an organic material so as to be in a paste state. When the frit coated between the lower substrate 110 and the encapsulation substrate 210 is melted by applying heat, the lower substrate 110 and the encapsulation substrate 210 may be bonded to each other through the fired frit, and internal elements of the display device may be completely encapsulated.

The sealant 310 overlaps the thermal transmission layer 23 on the lower substrate 110 such that the heat may be easily transmitted through the thermal transmission layer 23 in the manufacturing process.

In one embodiment, if the inclination portion 360N included in the peripheral portion 360E of the pixel definition layer 360 forms the concave inclination surface, when applying an impact to the display device 1, the impact wave is dispersed or offset by the inclination portion 360N such that the amount of the impact wave that is transmitted to the sealant 310 may be reduced. This is described with reference to FIG. 8 below.

Figure 8:
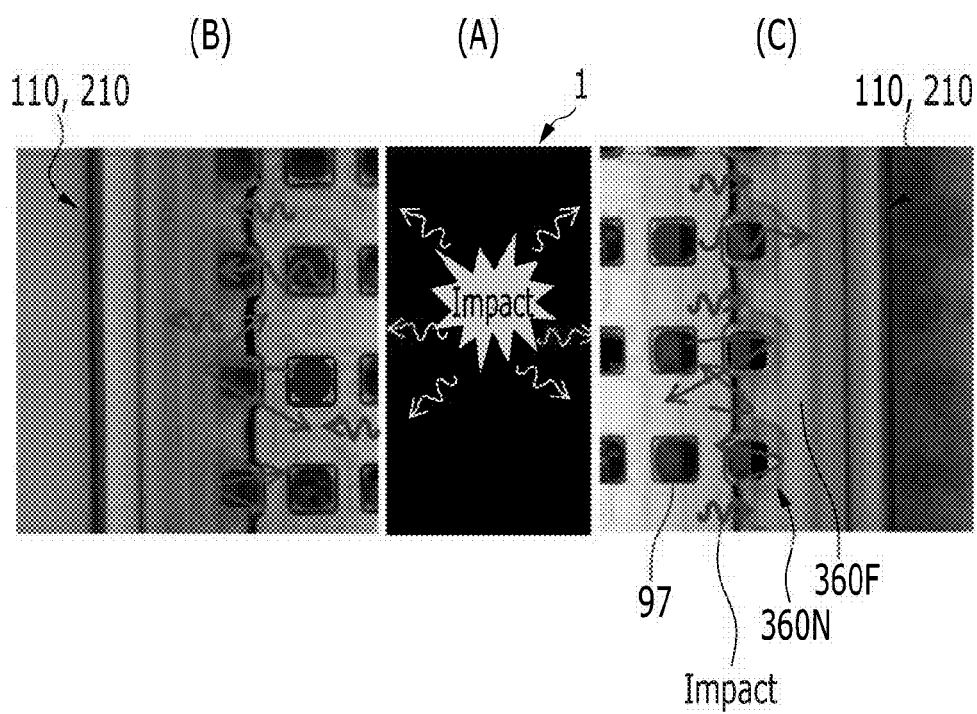
FIG. 8 is a view showing a phenomenon that an impact wave is prevented in a peripheral area an impact is applied to a display device according to an embodiment.

Section (A) of FIG. 8 shows the shape in which the impact wave is transmitted to the edge side of the display device 1 when the impact is applied to the display device 1, and sections (B) and (C) are the shapes in which the impact wave is dispersed or offset in the inclination portion 360N in the right and left peripheral areas of the display device 1 such that the impact wave is not transmitted to the edge region where the sealant 310 is positioned. Particularly, the inclination surface 36S of the inclination portion 360N forms the concave inclination surface such that the impact wave may be further effectively dispersed.

According to one embodiment, the impact wave may be effectively prevented from being transmitted to the sealant 310 such that rigidity of the display device 1 may be improved, and a falling weight strength improvement result of more than about 10% may be obtained.

Furthermore, the strength of the display device 1 is improved such that the width of the sealant 310 may be reduced, thereby reducing the area of the peripheral areas PA1 and PA2 or the bezel.

As shown in FIG. 5 and FIG. 6, the sealant 310 may not overlap the voltage transmission electrode 197, however it is not limited thereto, and it may overlap a portion of the voltage transmission electrode 197. According to an embodiment, the peripheral portion 360E covering the edge of the voltage transmission electrode 197 includes the thick spacer 360F such that the pressure by the sealant 310 is not transmitted to the voltage transmission electrode 197 although the sealant 310 overlaps the peripheral portion 360E, thereby the voltage transmission electrode 197 may be prevented from being easily broken. Accordingly, the display failure of the display area DA by a short between the voltage transmission electrode 197 and the other electrodes may be prevented.

Furthermore, according to an embodiment, since the sealant 310 overlaps the voltage transmission electrode 197, the width of the sealant 310 may be reduced. Accordingly, the adherence of the lower substrate 110 and the encapsulation substrate 210 may be improved such that the adhesion reliability is increased and the strength of the display device 1 may be increased. Also, a process margin when forming the sealant 310 may be reduced such that the sealant 310 may be formed to be close to the display area DA compared with the conventional art, thereby reducing the area of the peripheral areas PA1 and PA2 of the display device 1 or the bezel.

Also, according to an embodiment, in the peripheral portion 360E of the pixel definition layer 360, the main portion 360H and the inclination portion 360N having the lower height than the spacer 360F are positioned at both sides of the spacer 360F such that the change is smoothed when the distance between the lower substrate 110 and the encapsulation substrate 210 that are combined is partially changed, thereby entirely maintaining the uniform distance between the lower substrate 110 and the encapsulation substrate 210. The peripheral portion 360E may function as the buffer uniformly maintaining the distance between the lower substrate 110 and the encapsulation substrate 210, and the distance between the lower substrate 110 and the encapsulation substrate 210 near the sealant 310 and the distance between the lower substrate 110 and the encapsulation substrate 210 near the display area DA may be balanced. Accordingly, when the interval between the lower substrate 110 and the encapsulation substrate 210 is not uniform, the optical interference phenomenon generated by the light incident from the outside may cause a Newton's ring. Therefore, the Newton's ring may be prevented by the invention.

Next, a display device according to another embodiment will be described with reference to FIG. 9 to FIG. 11 as well as the previously described drawings. The same constituent elements as the embodiments described above are designated by the same reference numerals, and the duplicated description is omitted.

Figure 9:
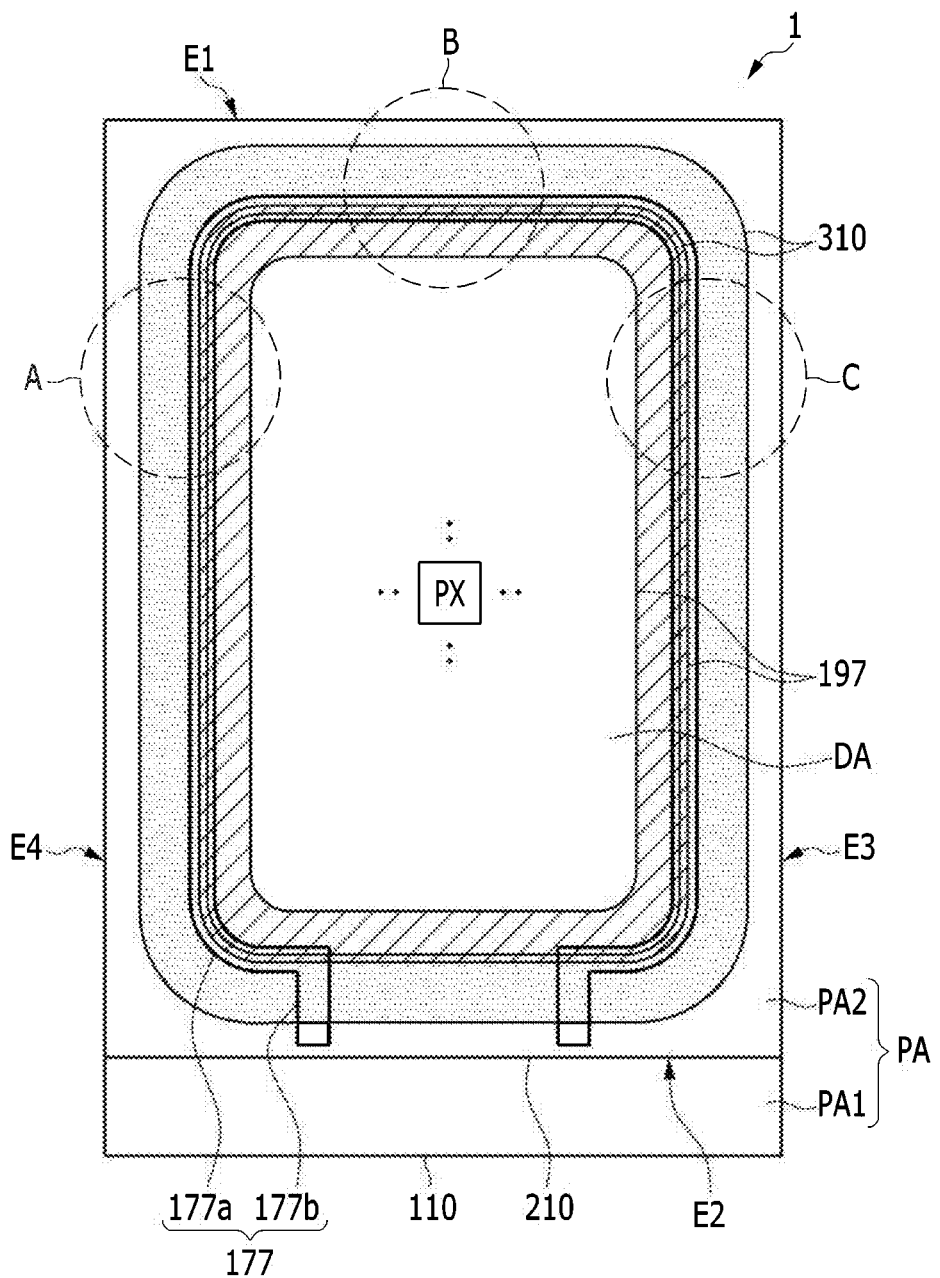
FIG. 9 is a layout view of a peripheral area of a display device according to an embodiment.
Figure 10:
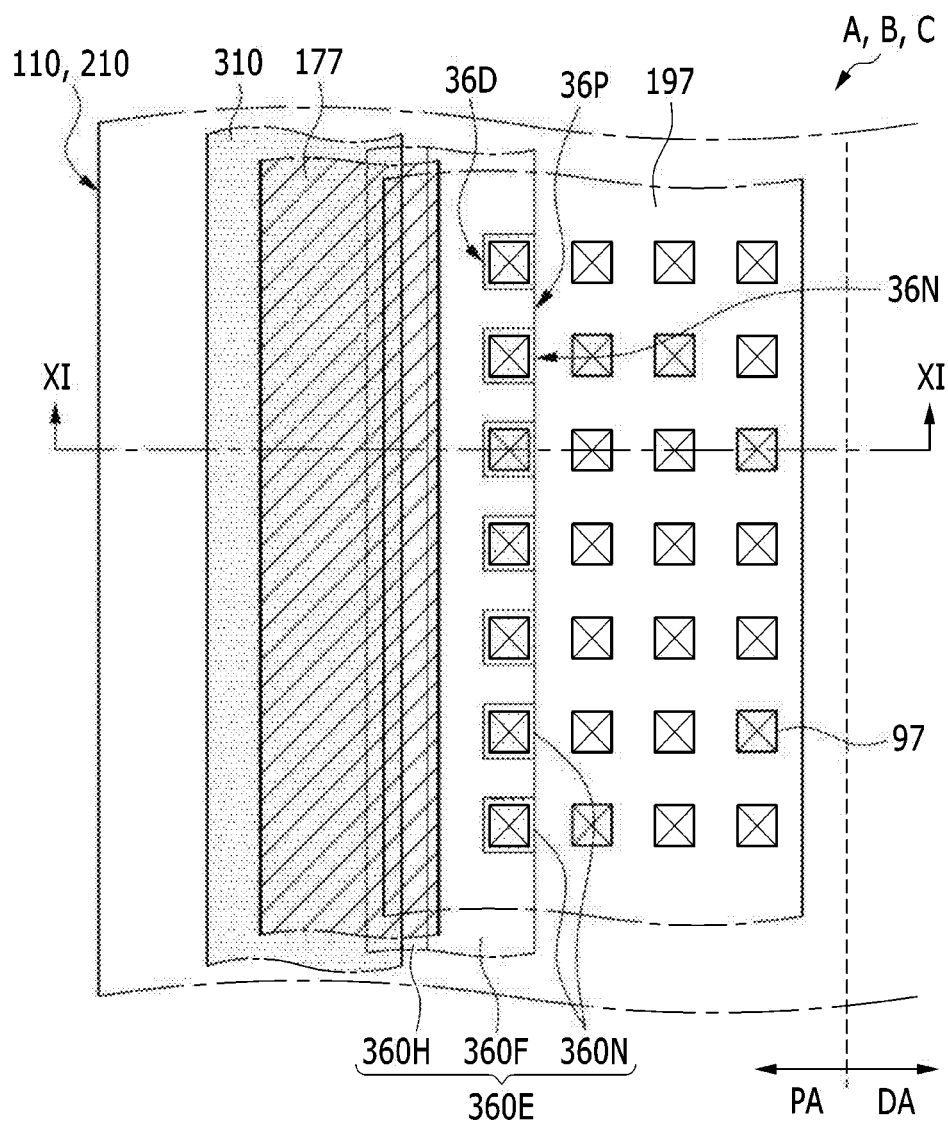
FIG. 10 is an enlarged layout view of a region A, a region B, or a region C as a part of a peripheral area of the display device shown in FIG. 9.
Figure 11:
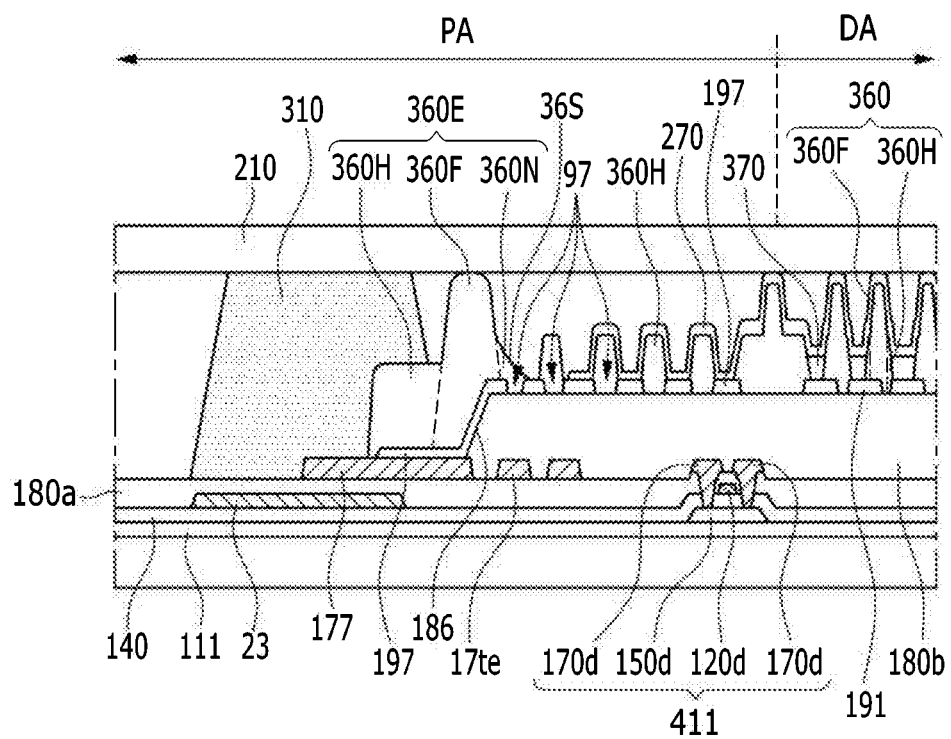
FIG. 11 is a cross-sectional view of a display device of FIG. 10 taken along a line XI-XI.

FIG. 9 is a layout view of a peripheral area of a display device according to an embodiment, FIG. 10 is an enlarged layout view of a region A, a region B, or a region C as a part of a peripheral area of the display device shown in FIG. 9, and FIG. 11 is a cross-sectional view of a display device of FIG. 10 taken along a line XI-XI.

Referring to FIG. 9 to FIG. 11, the display device 1 is the same as most of the above-described embodiment, however an example in which the sealant 310 overlaps the peripheral portion 360E of the pixel definition layer 360 is shown. FIG. 10 and FIG. 11 show the example in which the sealant 310 overlaps the main portion 360H among the peripheral portion 360E of the pixel definition layer 360, however it is not limited thereto, and the sealant 310 may overlap the main portion 360H and the spacer 360F of the peripheral portion 360E of the pixel definition layer 360.

Next, various examples of the structure of the peripheral area of the display device 1 will be described with reference to FIG. 12 to FIG. 14 as well as the previously described drawings. The same constituent elements as the embodiments described above designate the same reference numerals, and the duplicated description is omitted.

Figure 12:
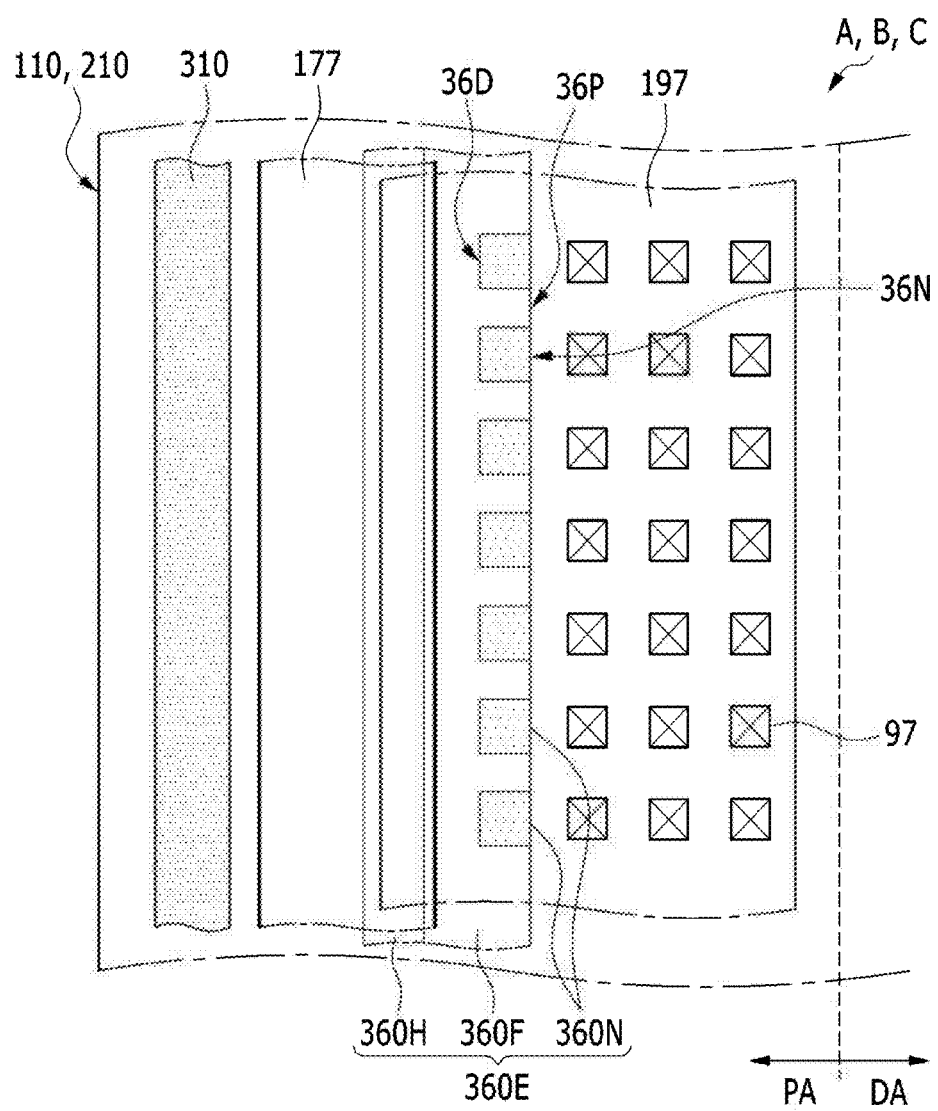
FIG. 12, FIG. 13, and FIG. 14 are enlarged layout views of a region A, a region B, or a region C as a part of a peripheral area of the display device shown in FIG. 3 according to another exemplary embodiment, respectively.
Figure 13:
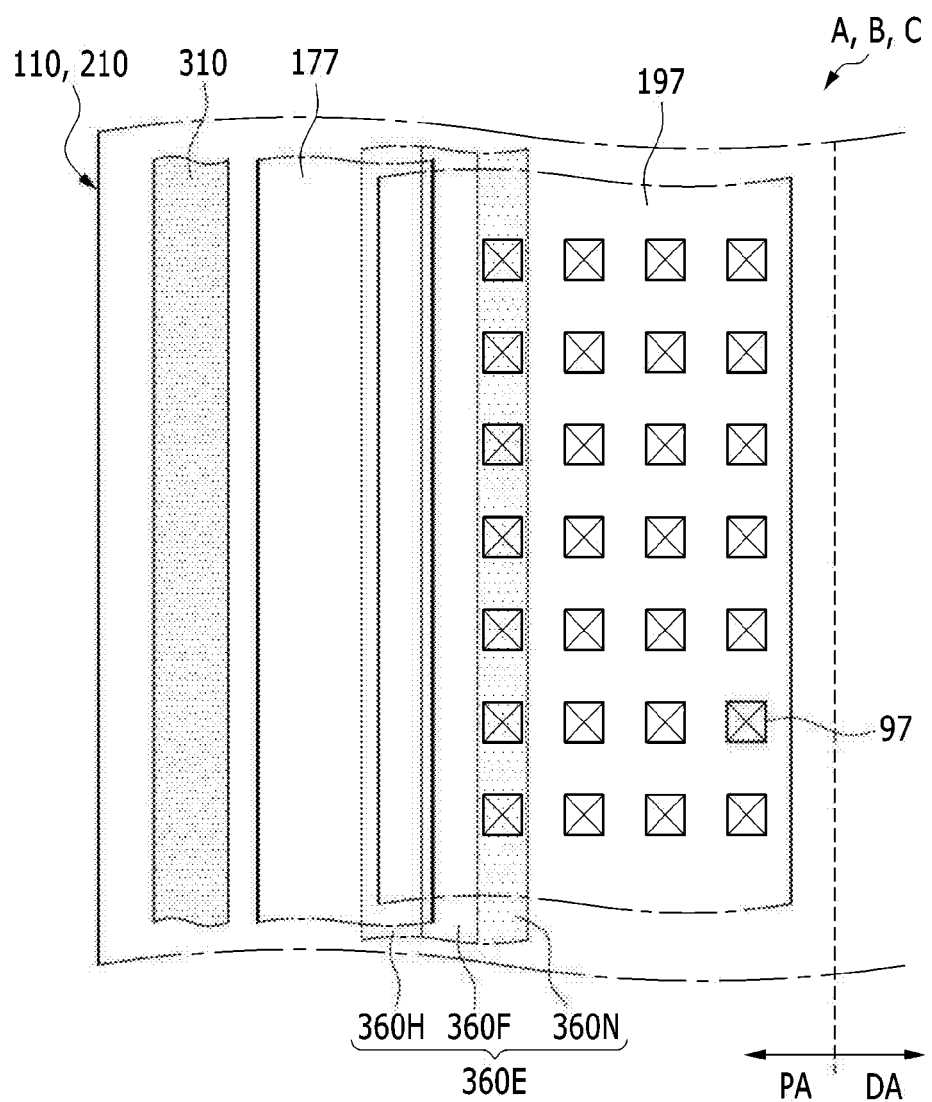
Figure 14:
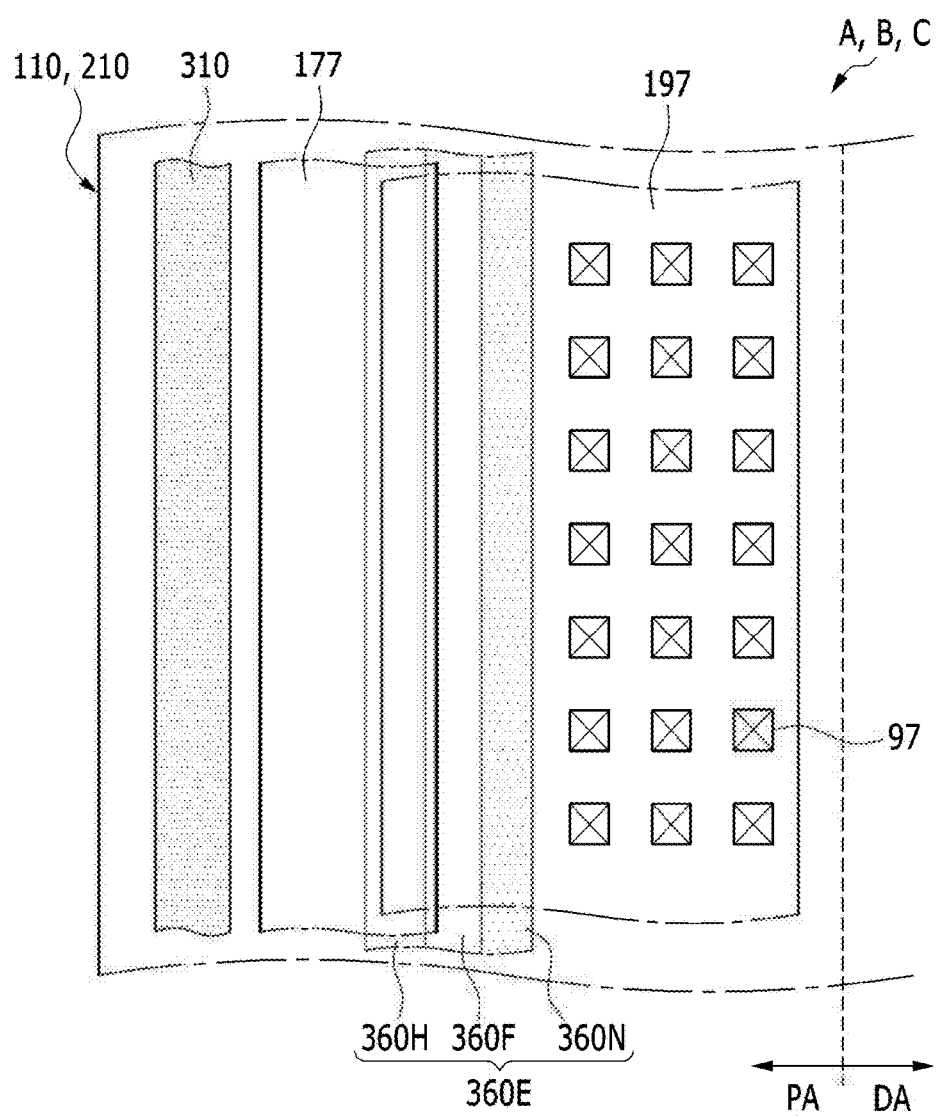

FIG. 12, FIG. 13, and FIG. 14 are an enlarged layout view of a region A, a region B, or a region C as a part of a peripheral area of the display device shown in FIG. 3, respectively.

Referring to FIG. 12, the display device 1 is the same as most of the embodiment shown in FIG. 1 to FIG. 8, however the inclination portion 360N of the peripheral portion 360E of the pixel definition layer 360 does not overlap the holes 97 of the voltage transmission electrode 197. In this case, the inclination portion 360N forms the concave inclination surface and the height of the inclination surface 36S thereof is decreased, and the impact wave may be dispersed or offset.

However, when the inclination portion 360N overlaps the portion of the plurality of holes 97 of the voltage transmission electrode 197, the concave inclination surface of the inclination portion 360N may be further concave compared with the case that the inclination portion 360N does not overlap the holes 97, as shown in FIG. 12.

Referring to FIG. 13, the display device 1 is the same as most of the embodiment shown in FIG. 1 to FIG. 8, however the shape of the spacer 360F of the peripheral portion 360E of the pixel definition layer 360 and the inclination portion 360N may be different.

The edge that is not connected to the main portion 360H among the edges of the spacer 360F of the peripheral portion 360E may be a substantially straight line. Among the edges of the spacer 360F, the edge connected to the main portion 360H and the edge that is not connected to the main portion 360H may extend to be substantially parallel. Accordingly the inclination portion 360N extending to be parallel to at least one among the upper side edge E1, the right side edge E3, and the left side edge E4 of the encapsulation substrate 210 may be entirely connected.

The edge connected to the spacer 360F of the inclination portion 360N and the edge that is not connected to the spacer 360F may extend to be substantially parallel. The inclination portion 360N may have the straight line shape extending to be parallel to at least one among the upper side edge E1, the right side edge E3, and the left side edge E4 of the encapsulation substrate 210.

The inclination surface 36S of the inclination portion 360N is lowered far from the portion connected to the spacer 360F. In one embodiment, the inclination surface 36S of the inclination portion 360N may be lowered toward the display area DA. The slope of the tangent line for the inclination surface 36S of the inclination portion 360N has the decreased absolute value farther away from the portion connected to the spacer 360F, that is, to the display area DA, such that the inclination surface 36S of the inclination portion 360N may form the concave curved surface. As an example, the edge of the inclination portion 360N may have the shape such as the straight dune.

The inclination portion 360N may overlap the portion of the plurality of holes 97 of the voltage transmission electrode 197, and in detail, the holes 97 of one column disposed closest to the voltage transmission line 177.

Referring to FIG. 14, the display device 1 is the same as most of the embodiment shown in FIG. 13, however the inclination portion 360N of the peripheral portion 360E of the pixel definition layer 360 does not overlap the holes 97 of the voltage transmission electrode 197. In this case, the inclination portion 360N also forms the concave inclination surface and the concave inclination surface 36S thereof may disperse and offset the impact wave.

Next, various examples of the plane shape of the peripheral portion 360E of the pixel definition layer positioned in the peripheral area of the display device 1 will be described with reference to FIG. 15 to FIG. 21.

Figure 19:
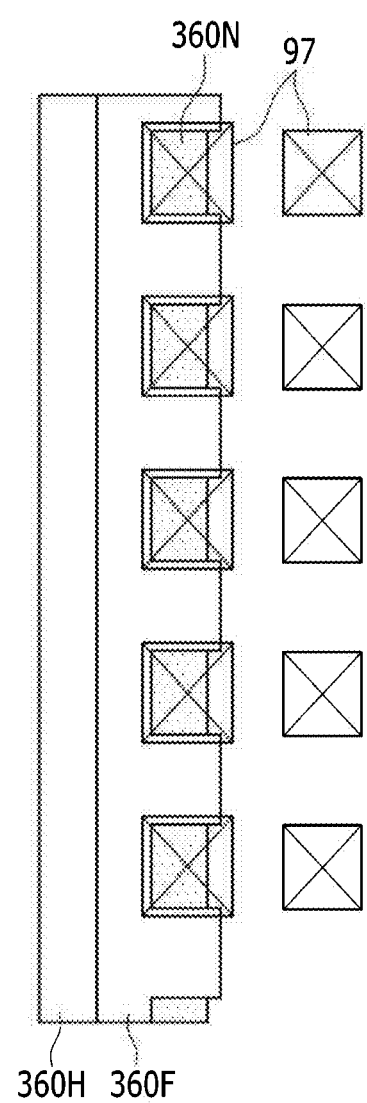
Figure 20:
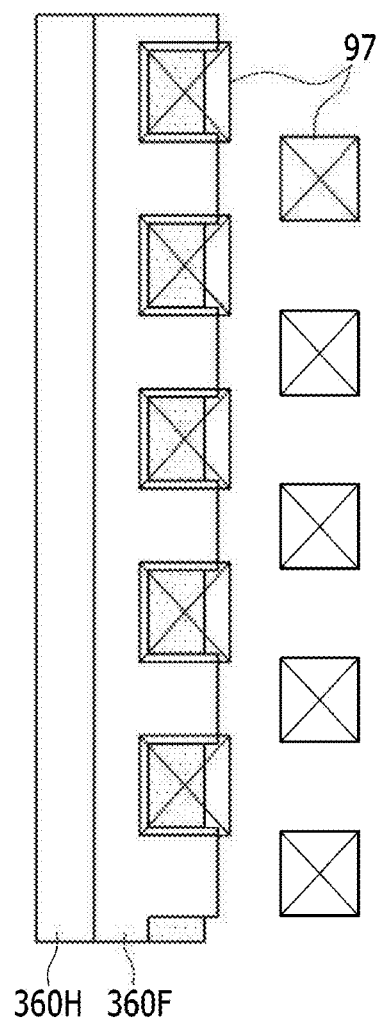
Figure 21:
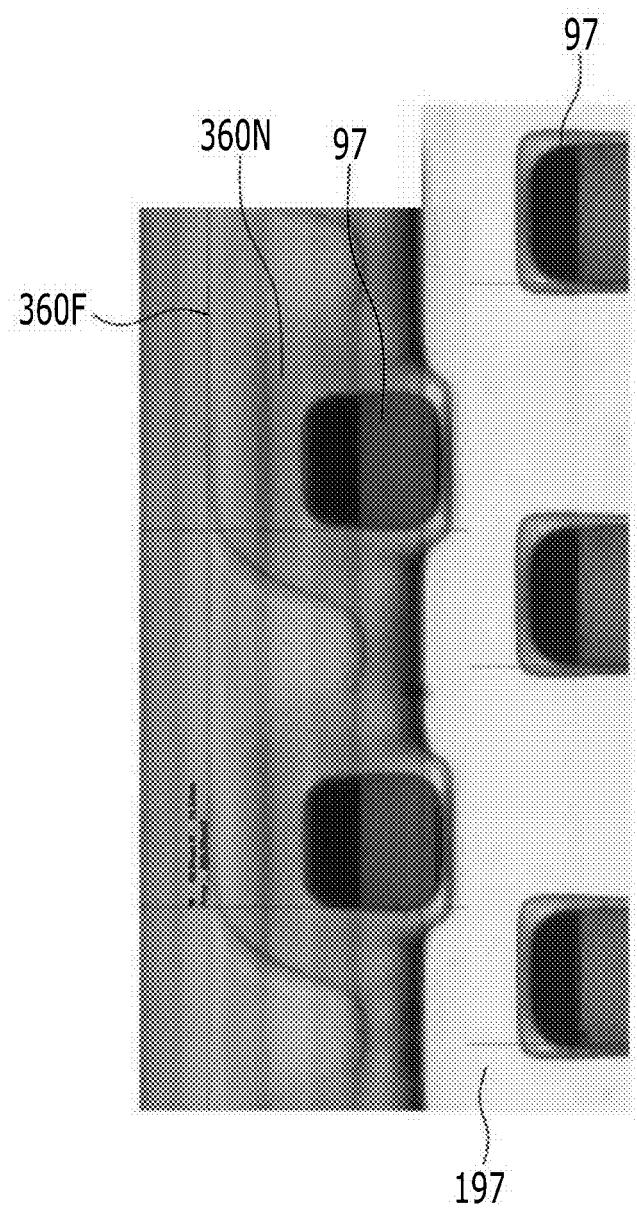
FIG. 21 is a photo showing an arrangement of a part of a peripheral area of a display device according to an embodiment.

FIG. 15, FIG. 16, FIG. 17, FIG. 18, FIG. 19, and FIG. 20 are top plan views showing a plane shape of a peripheral portion of a pixel definition layer positioned in a peripheral area of a display device according to embodiments, and FIG. 21 is a photo showing an arrangement of a part of a peripheral area of a display device according to an embodiment.

Figure 15:
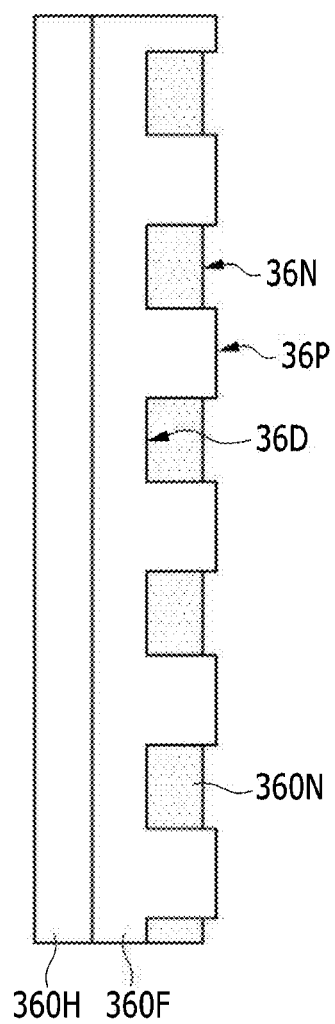
FIG. 15, FIG. 16, FIG. 17, FIG. 18, FIG. 19, and FIG. 20 are top plan views showing a plane shape of a peripheral portion of a pixel definition layer positioned in a peripheral area of a display device according to an embodiment.

First, referring to FIG. 15, the peripheral portion of the pixel definition layer 360 is the same as most of the peripheral portion 360E of the embodiment shown in FIG. 1 to FIG. 8. FIG. 15 is an example in which the recess portion 36D of the spacer 360F, the edge side of the convex portion 36P, and the edge of the inclination portion 360N are the quadrangle or the straight line.

Figure 16:
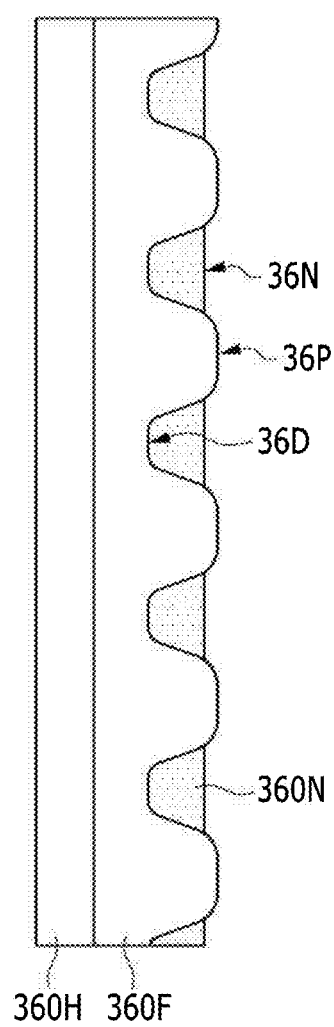

Referring to FIG. 16, the peripheral portion of the pixel definition layer 360 is the same as most of the peripheral portion 360E of the embodiment shown in FIG. 1 to FIG. 8, however the recess portion 36D of the spacer 360F and the edge side of the convex portion 36P form at least a partial curved line shape. Accordingly, the edge of the inclination portion 360N adjacent to the spacer 360F may also be formed of the curved line shape. Each outer edge 36N of the plurality of portions of the inclination portion 360N divided by the convex portion 36P of the spacer 360F may be formed of the straight line shape. Referring to FIG. 16, the outside edge of the convex portion 36P of the spacer 360F may be positioned outside the extending line of the outer edge 36N of the plurality of the portions of the inclination portion 360N, however it is not limited thereto.

Figure 17:
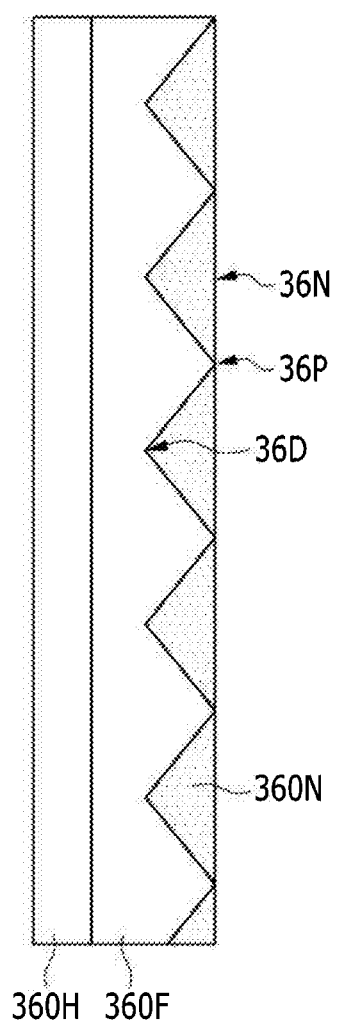

Referring to FIG. 17, the peripheral portion of the pixel definition layer 360 is the same as most of the peripheral portion 360E of the embodiment shown in FIG. 1 to FIG. 8, however a boundary line of the spacer 360F and the inclination portion 360N have a sawtooth shape or a zigzag shape. Accordingly, the edge of the inclination portion 360N adjacent to the spacer 360F may be also formed of the sawtooth shape or the zigzag shape. Each outer edge 36N of the plurality of portions of the inclination portion 360N divided by the convex portion 36P of the spacer 360F may be formed of the substantially straight line shape. Referring to FIG. 17, an apex of the convex portion 36P of the spacer 360F may be aligned to the extending line of the outer edge 36N of the plurality of portions of the inclination portion 360N, however it is not limited thereto.

Figure 18:
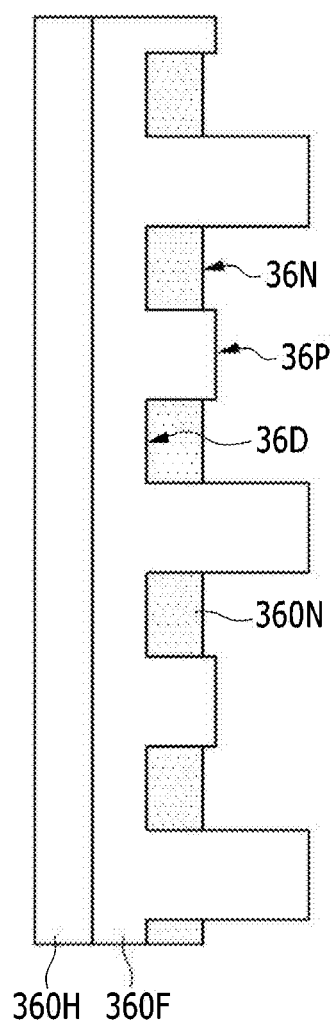

Referring to FIG. 18, the peripheral portion of the pixel definition layer 360 is the same as most of the peripheral portion 360E of the embodiment shown in FIG. 1 to FIG. 8, however the planar length of the convex portion 36P of the spacer 360F is not uniform. For example, in the edge having the protrusions and depressions of the spacer 360F, the convex portion 36P of the long length and the convex portion 36P of the short length may be alternately disposed according to the extending direction of the spacer 360F.

Referring to FIG. 19, the peripheral portion of the pixel definition layer 360 is the same as most of the peripheral portion 360E of the embodiment shown in FIG. 1 to FIG. 8 or the embodiment shown in FIG. 15. FIG. 19 shows an example in which each portion of the inclination portion 360N is disposed corresponding to the holes 97 of the voltage transmission electrode 197 to overlap the holes 97 when the inclination portion 360N is divided into the plurality of portions by the convex portion 36P of the spacer 360F. Furthermore, the holes 97 adjacent to the holes 97 overlapping the inclination portion 360N are aligned with the holes 97 overlapping the inclination portion 360N, thereby forming the approximate matrix shape.

Referring to FIG. 20, the peripheral portion of the pixel definition layer 360 is the same as most of the embodiment shown in FIG. 19, however the holes 97 adjacent to the holes 97 overlapping the inclination portion 360N are not aligned, but are shifted from the holes 97 overlapping the inclination portion 360N. That is, the holes 97 adjacent to the holes 97 overlapping the inclination portion 360N may be disposed on the line parallel to the space between the holes 97 overlapping the inclination portion 360N. FIG. 21 shows the plane shape of the display device corresponding to FIG. 20.

Next, a manufacturing method of the display device according to an embodiment will be described with reference to FIG. 22 to FIG. 24 as well as the above-described drawings.

Figure 22:
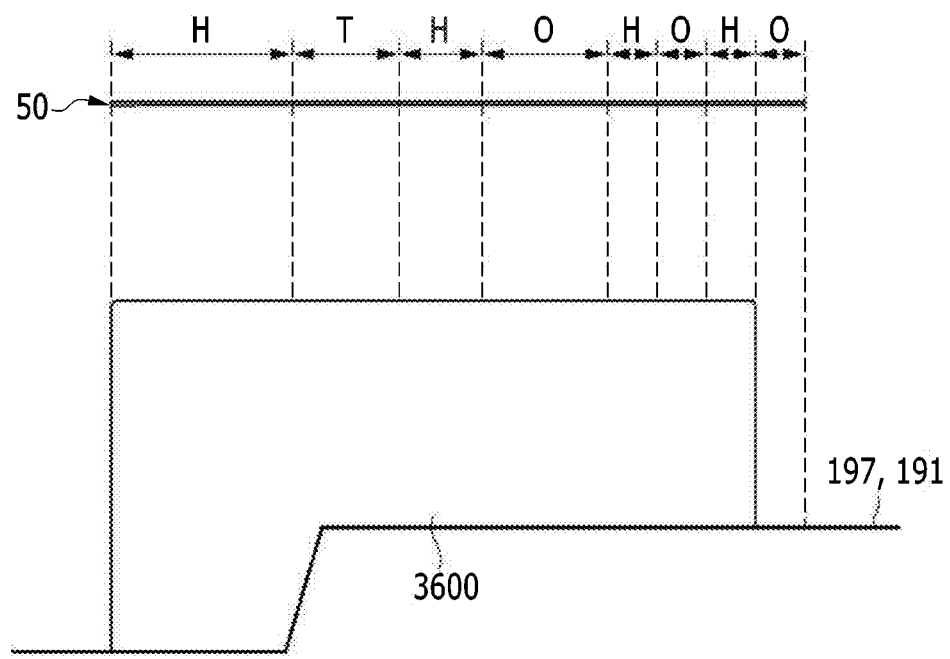
FIG. 22 is a cross-sectional view of a coating layer and a photomask for a pixel definition layer in one process of a manufacturing method of a display device according to an embodiment.
Figure 23:
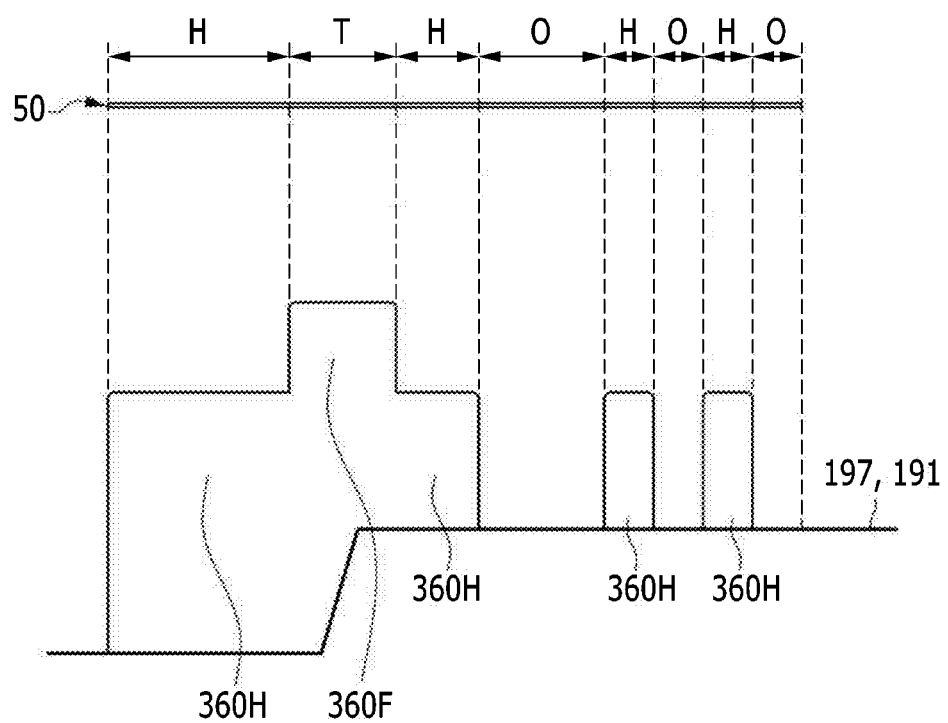
FIG. 23 is a cross-sectional view of a pixel definition layer in the process shown in FIG. 22 among a process of a manufacturing method of a display device according to an embodiment.
Figure 24:
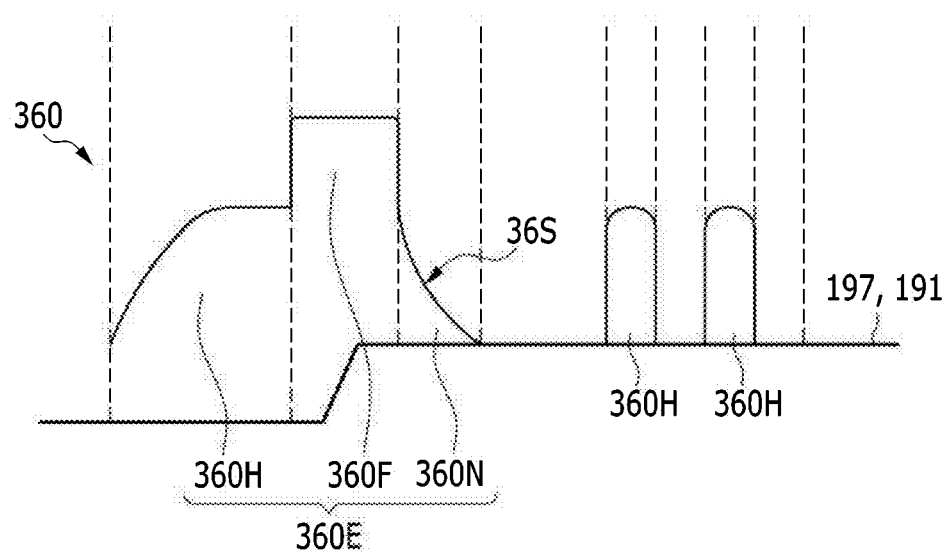
FIG. 24 is a cross-sectional view of a pixel definition layer in the process shown in FIG. 23 among a process of a manufacturing method of a display device according to an embodiment.

FIG. 22 is a cross-sectional view of a coating layer and a photomask for a pixel definition layer in one process of a manufacturing method of a display device according to an embodiment, FIG. 23 is a cross-sectional view of a pixel definition layer in the process shown in FIG. 22 in a process of a manufacturing method of a display device according to an embodiment, and FIG. 24 is a cross-sectional view of a pixel definition layer in the process shown in FIG. 23 in a process of a manufacturing method of a display device according to an embodiment.

First, referring to FIG. 22 along with FIG. 5 and FIG. 6, the buffer layer 111, the semiconductor layer, the gate insulating layer 140, the plurality of gate conductors, the first passivation layer 180a, the plurality of data conductors, and the second passivation layer 180b are formed on the lower substrate 110 including the transparent glass or plastic, and the pixel electrode layer including the pixel electrode 191 and the voltage transmission electrode 197 is formed thereon.

The pixel electrode layer includes the top surface having a high portion and a low portion formed by an following step, for example, a step due to the edge side surface 186 of the above-described second passivation layer 180b.

Next, the photosensitive material such as the polyacrylates resin or the polyimide resin is coated on the pixel electrode layer to form a coating layer 3600.

Subsequently, a photomask 50 is disposed on the coating layer 3600 and exposure is performed. The photomask 50 includes a transmissive part T where most of the light is transmitted, a semi-transmissive part H where the light is partially transmitted, and a light blocking portion O where most of the light is not transmitted. To control the transmission amount, the semi-transmissive part H may include a pattern such as a slit or a lattice or may include a semi-transparent layer.

Next, referring to FIG. 23, the coating layer 3600 exposed through the photomask 50 is developed to form a main portion 360H and a spacer 360F. When the coating layer 3600 has negative photosensitivity of which the portion that is not irradiated by the light is removed, the main portion 360H corresponding to the semi-transmissive part H of the photomask 50 and the spacer 360F corresponding to the transmissive part T of the photomask 50 are formed, and the coating layer 3600 corresponding to the light blocking portion O of the photomask 50 may be removed. The thickness of the spacer 360F is greater than the thickness of the main portion 360H. Particularly, in the peripheral area of the display device, the main portion 360H is respectively positioned at both sides of the spacer 360F covering the edge of the voltage transmission electrode 197, and two main portions 360H are connected to the spacer 360F. Depending on the step of the pixel electrode layer, the bottom surface of the main portion 360H connected to the left side of the spacer 360F may be lower than the bottom surface of the main portion 360H connected to the right side of the spacer 360F. Here, the right side of the spacer 360F may be the side that is closer to the display area DA. The thickness of the main portion 360H connected to the left side of the spacer 360F may be greater than the thickness of the main portion 360H connected to the right side of the spacer 360F.

When the photosensitive material included in the coating layer 3600 has positive photosensitivity, as opposed to negative photosensitivity, the transmittance of the photomask 50 is conversely changed and the coating layer 3600 is exposed, thereby forming the main portion 360H and the spacer 360F.

Next, referring to FIG. 24, a hardening process of applying heat or ultraviolet rays to the main portion 360H and the spacer 360F is performed to form the pixel definition layer 360. In this case, in the peripheral area of the display device, the top surface of the main portion 360H connected to the left side of the spacer 360F covering the edge of the voltage transmission electrode 197 may be formed of the convex curved surface, and the top surface of the main portion 360H connected to the right side of the spacer 360F may be formed of the concave inclination surface 36S, thereby forming the inclination portion 360N. This is one of the reasons that the thickness of the main portion 360H connected to the left side of the spacer 360F is relatively thick and the thickness of the main portion 360H connected to the right side of the spacer 360F is relatively thin.

When the main portion 360H connected to the right side of the spacer 360F overlaps the holes 97 of the voltage transmission electrode 197, the concave inclination surface 36S of the inclination portion 360N may be further well formed.

According to another embodiment, in the peripheral portion 360E of the pixel definition layer 360, the main portion 360H positioned between the spacer 360F and the sealant 310 may be omitted and may have the top surface having substantially the same height as the top surface of the spacer 360F.

While this invention has been described in connection with certain embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a first substrate including:
        a display area including a plurality of pixels, and
        a peripheral area positioned around the display area;
    a thin film transistor positioned on the first substrate;
    a pixel electrode layer positioned on the thin film transistor and including a plurality of pixel electrodes positioned in the display area; and
    a voltage transmission line positioned in the peripheral area and transmitting a common voltage;
    a passivation layer positioned between the thin film transistor and the pixel electrode layer, wherein the passivation layer includes an edge side surface exposing the voltage transmission line; and
    a pixel definition layer positioned on the pixel electrode layer and including a peripheral portion overlapping a voltage transmission electrode,
    wherein the peripheral portion includes:
        a spacer which includes at least one part covering the edge side surface of the passivation layer, and the pixel electrode layer includes the voltage transmission electrode; and
        an inclination portion connected to the spacer and positioned at a first side of the spacer, wherein the inclination portion has a concave inclination surface.

2. A display device comprising:
    a first substrate including:
        a display area including a plurality of pixels, and
        a peripheral area positioned around the display area;

a thin film transistor positioned on the first substrate;

a pixel electrode layer positioned on the thin film transistor and including a plurality of pixel electrodes positioned in the display area; and a pixel definition layer positioned on the pixel electrode layer and including a peripheral portion overlapping a voltage transmission electrode, wherein the peripheral portion includes:

a spacer: and an inclination portion connected to the spacer and positioned at a first side of the spacer, wherein the inclination portion has a concave inclination surface, and an edge of the spacer at the first side has a shape of protrusions and depressions and includes recess portions and convex portions that are alternately arranged.

3. The display device of claim 2, wherein the inclination portion includes a plurality of portions positioned in the recess portions in a plan view, and each of the plurality of portions included in the inclination portion has a concave inclination surface.

4. The display device of claim 3, wherein the voltage transmission electrode includes a plurality of holes, and each of the plurality of the portions of the inclination portion respectively overlaps each of the holes.

5. The display device of claim 4, wherein a hole adjacent to a first hole overlapping the inclination portion among the plurality of holes is disposed to be aligned with the first hole.

6. The display device of claim 4, wherein a hole adjacent a first hole overlapping the inclination portion among the plurality of holes is disposed to be shifted from the first hole.

7. The display device of claim 2, wherein an edge of the spacer at the first side having the protrusions and depressions shape includes a first convex portion and a second convex portion having different lengths from each other.

8. A display device comprising:

a first substrate including:

a display area including a plurality of pixels, and a peripheral area positioned around the display area;

a thin film transistor positioned on the first substrate;

a pixel electrode layer positioned on the thin film transistor and including a plurality of pixel electrodes positioned in the display area; and a pixel definition layer positioned on the pixel electrode layer and including a peripheral portion overlapping a voltage transmission electrode, wherein the peripheral portion includes:

a spacer; and an inclination portion connected to the spacer and positioned at a first side of the spacer, wherein the inclination portion has a concave inclination surface, the voltage transmission electrode include a plurality of holes, and the inclination portion overlaps the plurality of holes.

9. A method for manufacturing a display device, comprising:

forming a thin film transistor on a first substrate including a display area and a peripheral area around the display area;

forming, on the thin film transistor, a pixel electrode layer including a plurality of pixel electrodes positioned in the display area;

coating a photosensitive material on the pixel electrode layer to form a coating layer;

exposing the coating layer by using a photomask including a light transmissive part, a light blocking part, and a semi-transmissive part;

developing the exposed coating layer; and hardening the developed coating layer to form a pixel definition layer including a peripheral portion overlapping a voltage transmission electrode, wherein the peripheral portion includes a spacer and an inclination portion connected to the spacer and positioned at a first side of the spacer in the peripheral area, the first side facing toward the display area, wherein an edge of the spacer at the first side has a shape of protrusions and depressions and includes recess portions and convex portions that are alternately arranged, and wherein the inclination portion has a concave inclination surface, which disposed outside the display area and faces toward a boundary between the display area and the peripheral area.

10. The method of claim 9, wherein the peripheral portion further includes a main portion connected to the spacer and positioned at a second side opposite to the first side of the spacer.

11. The method of claim 10, wherein a thickness of the coating layer corresponding to the main portion is thicker than a thickness of the coating layer corresponding to the inclination portion.

* * * * *